(12) United States Patent
Arimoto

(10) Patent No.: US 8,024,674 B2
(45) Date of Patent: Sep. 20, 2011

(54) SEMICONDUCTOR CIRCUIT DESIGN METHOD AND SEMICONDUCTOR CIRCUIT MANUFACTURING METHOD

(75) Inventor: Hiroshi Arimoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 266 days.

(21) Appl. No.: 12/412,612

(22) Filed: Mar. 27, 2009

(65) Prior Publication Data

US 2009/0249263 A1    Oct. 1, 2009

(30) Foreign Application Priority Data

Mar. 28, 2008   (JP) ................ 2008-086738

(51) Int. Cl.
G06F 17/50    (2006.01)
G06F 9/455    (2006.01)
(52) U.S. Cl. .......................... 716/51; 716/106
(58) Field of Classification Search ............ 716/51, 716/106
See application file for complete search history.

(56) References Cited

U.S. PATENT DOCUMENTS

| | | | |
|---|---|---|---|
| 5,764,532 A * | 6/1998 | Patel ............... | 716/113 |
| 6,374,205 B1 | 4/2002 | Kuribayashi et al. | |
| 6,557,148 B1 | 4/2003 | Nishida et al. | |
| 6,618,837 B1 * | 9/2003 | Zhang et al. ............. | 716/111 |
| 7,047,505 B2 | 5/2006 | Saxena et al. | |
| 2002/0156609 A1 | 10/2002 | Hirata et al. | |
| 2005/0172251 A1 * | 8/2005 | Chang et al. ............ | 716/6 |
| 2006/0142987 A1 | 6/2006 | Ishizu et al. | |

FOREIGN PATENT DOCUMENTS

| | | |
|---|---|---|
| JP | 8-04475 A | 2/1996 |
| JP | 11-296575 A | 10/1999 |
| JP | 2001-202394 A | 7/2001 |
| JP | 2002-318829 A | 10/2002 |
| JP | 2006-178907 A | 7/2006 |

\* cited by examiner

*Primary Examiner* — Suresh Memula
(74) *Attorney, Agent, or Firm* — Fujitsu Patent Center

(57) ABSTRACT

A computer converts dimensions of design patterns of components of the transistors configuring the semiconductor circuit or component parameters extracted from in-design physical characteristics of the transistors into simulation parameters inputted to the simulator, organize the plurality of transistors included in the semiconductor circuit into a plurality of groups, selects any selection groups from the plurality of groups, sets fixed parameter values as component parameters of the non-selected groups other than the selection groups in the plurality of groups, sets the combinations of the component parameters in the selection groups, acquires circuit characteristics with respect to each combination of the component parameters, selects a group as a next selection group different from the selected groups, and repeatedly executing the setting the fixed parameter values through the selects a group as a next selection group different.

16 Claims, 24 Drawing Sheets

FIG.10

SS1 — PROCESS OF ORGANIZING PLURAL GROUPS EACH INCLUDING PLURAL TRANSISTORS Tr SELECTED FROM ALL TRANSISTORS Tr IN CIRCUIT

SS2 — PROCESS OF GENERATING TABLE OF COMPONENT PARAMETERS OF Tr PER GROUP

SS3 — PROCESS OF SELECTING ARBITRARY ONE GROUP FROM GROUPS

SS4 — PROCESS OF SETTING SPECIFIED PARAMETERS IN NON-SELECTED GROUP FROM GROUPS

SS5 — PROCESS OF EXECUTING CIRCUIT CHARACTERISTIC SIMULATION BASED ON PARAMETERS WITH LAYOUT COMBINATIONS IN SELECTION GROUPS

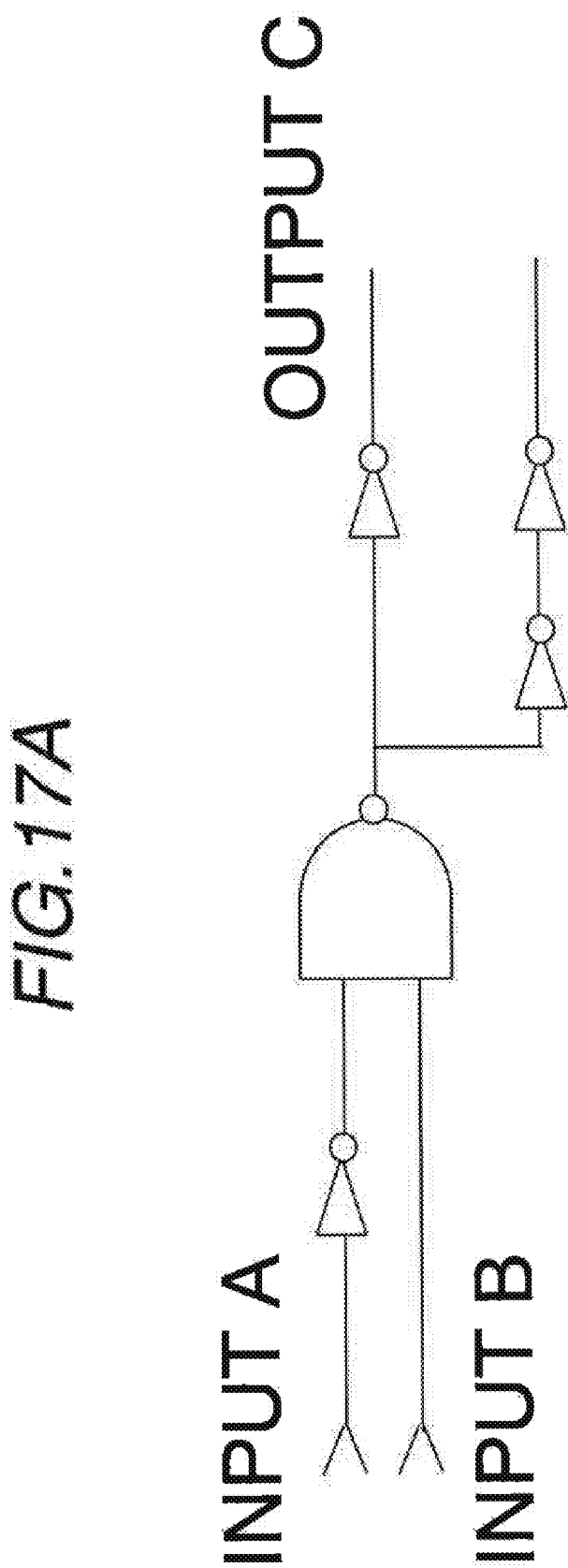

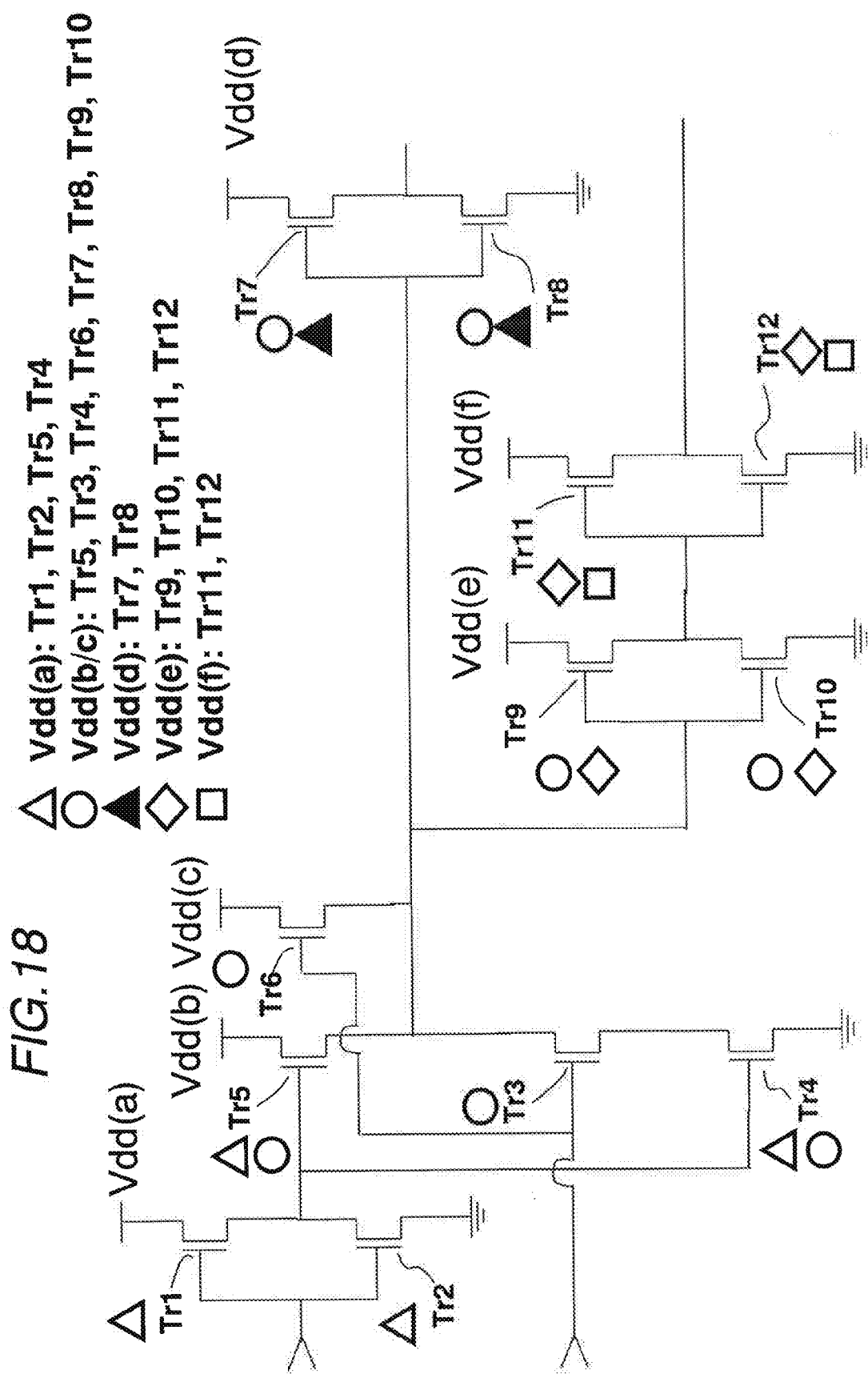

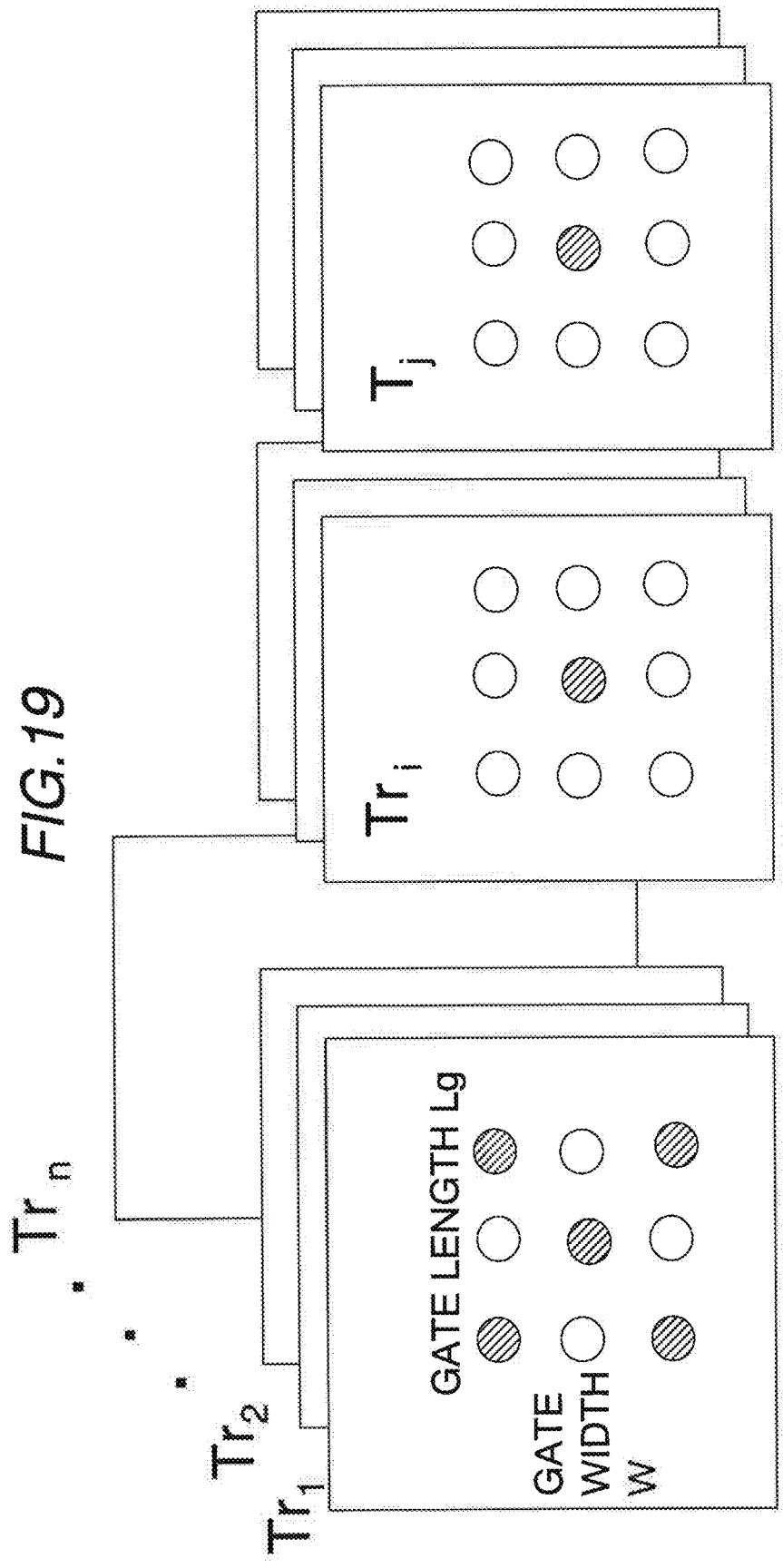

SEMICONDUCTOR CIRCUIT DESIGN METHOD AND SEMICONDUCTOR CIRCUIT MANUFACTURING METHOD

CROSS-REFERENCE TO RELATED APPLICATIONS

This application is based upon and claims the benefit of priority of the prior Japanese Patent Application No. JP2008-086738, filed on Mar. 28, 2008, the entire contents of which are incorporated herein by reference.

FIELD

The embodiment(s) discussed herein is (are) related to a semiconductor circuit design method and a semiconductor circuit manufacturing method.

BACKGROUND

Over the recent years, with advanced micronization of LSI, circuit characteristics have been greatly influenced by accuracy of physical quantities of shapes of layout patterns, layout positions, etc of circuit elements, or scatters in these physical quantities in a manufacturing process. Further, there has been proposed a method of taking the influence thereof into a prediction of the circuit characteristics and optimizing the circuit characteristics.

Conventional technologies are not, however, sufficient for optimizing the circuit characteristics of a whole design target circuit including a multiplicity of elements and wirings due to a heavy load in terms of a calculation quantity. For example, a circuit design includes performing a layout of a gate dimension and a gate width in the way of taking account of a balance between a current driving force of each transistor and a load. A technology of determining the optimal gate dimension and gate width in the design target circuit as a whole is not yet, however, actualized.

SUMMARY

The technologies given above have no contrivance for optimizing the actual circuit including the multiplicity of elements. According to an aspect of the embodiment, there is proposed a technology that can be applied to a design of a semiconductor circuit including the multiplicity of elements. The present technology is capable of efficiently acquiring a layout of the semiconductor circuit that conforms with desired circuit characteristics, and manufacturing an optimized circuit.

Namely, according to one aspect of the disclosure, a semiconductor circuit design method uses a simulator on a computer, simulating behaviors of transistors with simulation parameters, and generating circuit characteristics of a semiconductor circuit including the transistors. According to one aspect, the computer executes: converting component parameters extracted from (1) dimensions of design patterns of components of the transistors configuring the semiconductor circuit or (2) in-design physical characteristics of the transistors into simulation parameters inputted to the simulator; organizing the plurality of transistors included in the semiconductor circuit into a plurality of groups; selecting a selection group from the plurality of groups; (A) setting fixed parameter values as component parameters of the non-selected groups other than the selection group in the plurality of groups; (B) setting the combinations of the component parameters in the selection group; (C) executing the simulation through the converting the component parameters; (D) acquiring circuit characteristics with respect to each combination of the component parameters; and selecting a group as a next selection group different from the selected groups, and repeatedly executing (A) through (D). The computer further executes obtaining a first mapping relation representing a relation between the circuit characteristics of the semiconductor circuit and the component parameters on the basis of results of the plurality of simulations executed based on the plural combinations of the component parameters; calculating values of the plurality of circuit characteristics corresponding to plural combinations of values of the component parameters by use of the first mapping relation; selecting a part of the plurality of values of the circuit characteristics on the basis of at least any one of restriction items containing the values of the circuit characteristics and the component parameters; obtaining the component parameters corresponding to the selected values of the circuit characteristics, design patterns corresponding to the component parameters, or the in-design physical characteristics of the transistors corresponding to the component parameters The object and advantage of the embodiment will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

FIG. 10 is a diagram illustrating a process by a simulation module;

FIG. 17A is a diagram illustrating an example of a circuit including the inverter and NAND;

FIG. 18 is a diagram illustrating a result of grouping the transistors;

FIG. 19 is an explanatory diagram of a procedure of setting the parameters in the whole circuit.

DESCRIPTION OF EMBODIMENT(S)

Preferred embodiments of the present invention will hereinafter be explained with reference to accompanying drawings. As the embodiments, a technology of a computer aided design equipment, a computer aided design method and semiconductor circuit manufacturing method will hereinafter be described. Configurations in the following embodiments are exemplifications, and the present invention is not limited to the configurations in the embodiments.

According to the technology, the layout of the semiconductor circuit, which conforms with the desired circuit characteristics, can be efficiently acquired.

Figure 1:
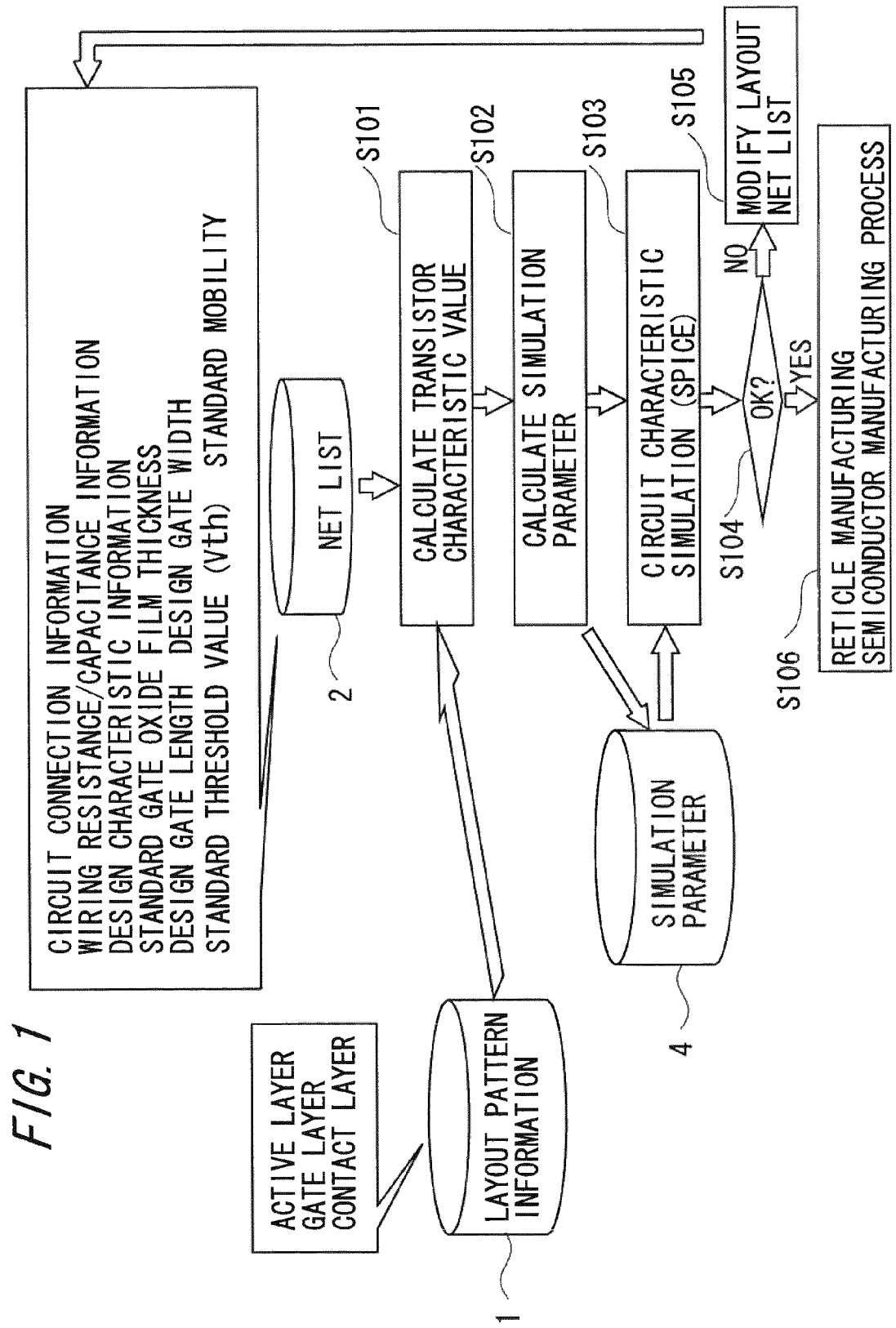
FIG. 1 is a diagram illustrating an outline of a semiconductor manufacturing process.

FIG. 1 illustrates an outline of a semiconductor manufacturing process according to the embodiment. In the semiconductor manufacturing process, S101 through S105 are steps related to a design of a semiconductor device, and S106 is a step related to manufacture of the semiconductor device.

A semiconductor circuit generally includes a multiplicity of transistors. The semiconductor circuit is, at a final stage of the design, described by layout pattern information which defines multilayered graphic patterns and by a net list which describes a connecting relation between an element and an element in design data.

The computer aided design equipment in the embodiment extracts component parameters of respective transistors from layout pattern information 1 of the transistors included in the semiconductor circuit and from a net list 2. The component parameters contain a layout parameter for specifying a graphic pattern, i.e., a layout pattern of the transistor, and contain a physical characteristic parameter for specifying a physical characteristic used upon designing the transistor (in-design physical characteristics of the transistor).

The layout parameter is, for example, a value determined from dimensions of the layout pattern (dimensions of design patterns of components of the transistors) such as a gate width and a gate length in the layout pattern of the transistor. The physical characteristic parameter is, e.g., a threshold value, used upon designing the transistor, a mobility of electrons in a substrate material from which the transistor is made and so forth.

The computer aided design equipment calculates the characteristic values of the respective transistors manufactured based on the component parameters described above (S101). The characteristic value is a value determined from a current-voltage characteristic that is actually, it is predicted, held by the transistor designed based on the component parameters. The transistor characteristic value is, e.g., a mutual conductance defined as a variation quantity of a drain current with respect to a variation quantity of a gate voltage, a threshold value of the transistor, a drain current when the gate voltage and the drain voltage are fixed to predetermined values, and so on. The step S101 corresponds to converting the component parameters into transistor characteristic value.

Moreover, the computer aided design equipment calculates a simulation parameter 4 necessary for a circuit simulation from the acquired transistor characteristic value (S102). The step S102 corresponds to converting the transistor characteristic value into simulation parameter. The steps S101 and S102 correspond generically to converting component parameters. Then, the computer aided design equipment starts up a circuit simulator, and the circuit simulator executes a circuit simulation called an SPICE (Simulation Program Integrated Circuits Especially) simulation (S103). It is noted, as illustrated in FIG. 1, the circuit simulation includes referring to the net list 2. The step S103 corresponds to setting combinations of the component parameters, and executing the simulation, acquiring circuit characteristics. As a result of the circuit simulation, circuit characteristics such as electric power consumption and delay time are obtained. Then, it is determined whether the acquired circuit characteristic satisfies a design target value or not (S104). If the acquired circuit characteristic satisfies the design target value, mask data for manufacturing a semiconductor mask is generated based on the component parameters (the layout pattern and the physical characteristic parameter), thereby manufacturing a photo mask for manufacturing the semiconductor device. Then, a pattern of the photo mask is transferred onto a semiconductor substrate, thus manufacturing the semiconductor device (S106).

As a result of the circuit simulation, if the circuit characteristic showing the design target value is not acquired, however, there arises a necessity for changing the layout pattern information 1 and the net list 2. Such being the case, the layout pattern information 1 and the net list 2 are modified (S105), and the processes from S101 onward are again executed.

For supporting the design process in such a manufacturing process and facilitating the generation of a desired layout, the computer aided design equipment enables the circuit simulation to be executed a plural number of times in a way that changes a multiplicity of component parameters. Namely, the computer aided design equipment simulates the circuit characteristic of the semiconductor integrated circuit with combinations of the parameter values of the plurality of changed component parameters.

On this occasion, with respect to the transistors within the circuit, in the case of trialing the combinations of all of the changed component parameters, there exist the combinations given by a power of the number of transistors building up the circuit against the number of combinations of the component parameters about one single transistor. For example, a gate length and a gate width are selected as the component parameters, and, in the case of setting three levels (three value-combinations) of the component parameters in a way that deflects the level of the component parameters up and down in magnitude from a central value, 9-way variations are given to one piece of transistor. Accordingly, supposing that the number of transistors including in the semiconductor circuit is set to 100, there are $9^{100}$ combinations. In such a case, a simulation execution count rises explosively with a circuit scale, and an actually execution-disabled case comes out.

The computer aided design equipment provides a function of setting a proper number of combinations of the component parameters so as not to cause such a situation. Then, the computer aided design equipment executes the simulation based on the proper combinations thereof by limiting the variations of the component parameters to the proper number of combinations even when the circuit scale is large. The computer aided design equipment provides a more desirable circuit layout than in the prior arts by use of the result of the simulation with the (proper) number of combinations.

Therefore, the computer aided design equipment does not, in the case of changing the component parameters of the transistors included in the semiconductor circuit, execute the circuit simulation by combining all of the component parameters with the changed parameter values. The computer aided design equipment takes the following procedure in place of this type of a round-robin procedure. To be specific, the procedure includes:

organizing a plurality of groups including the plurality of transistors selected from all of the transistors within the semiconductor circuit;

(2) selecting any one group, as a target group (corresponding to a selected group) from the thus-organized plural groups;

(3) setting fixed parameter values in the non-selected groups other than the target group in the thus-organized plural groups;

(4) executing the circuit characteristic simulation a number of times equivalent to the number of combinations in accordance with these combinations of the changed component parameter values in a way that corresponds to changing the layout or the physical characteristic parameter in the target group, and, in this case, while fixing the physical characteristic parameter, allowing the execution of the circuit characteristic simulation based on the combinations in which only the component parameter value corresponding to the layout is changed; and (5) selecting a next target group from the groups other than the group already selected as the target group, and repeatedly executing the steps (3) and (4).

Generally, in the semiconductor integrated circuit, the electric signal is, while being propagated, inverted depending on ON-and-OFF states of the transistor. The semiconductor circuit propagates the electric signal and functions as a logic circuit. Namely, when a certain transistor transitions from the OFF-state to the ON-state or from the ON-state to the OFF-state, the electricity is charged and discharged via the transistor and a power source to which the transistor is connected or via a ground line. As a result, an input potential of the transistor at a next stage, which is defined as a load, changes, and the signal is propagated.

What the attention is herein paid to is a path of the electric current flowing when the transistor transitions from the OFF-state to the ON-state and vice versa. Then, it is recognized that a drive characteristic of the transistor which configures such a path and a load characteristic formed by the transistor at the next stage rate-determine a local signal delay.

With respect to the transistor constituting the partial circuit which determines (so called, rate-determines, rate-controls, or rules) the local signal delay, the circuit characteristic to some extent can be acquired when taking account of influence of dependency on the combinations of the component parameters. The computer aided design equipment sets the plurality of groups including the plurality of transistors selected from the transistors included in the design target semiconductor circuit while taking this influence into consideration. Namely, herein, the transistors are grouped for every partial circuit that determines the local signal delay. Then, the simulation is carried out for each of the plural combinations of the component parameters generated by changing the component parameters of the intra-group transistors. With respect to the combination of the component parameters applied to a plurality of the groups, however, the variations of the combinations are not generated.

Herein, as described above, an aggregation of the transistors, which form the current path connected in series to the ground line from the power source, is set as one group. Then, the transistors having such a parallel relation that both of terminals (a source and a drain) of the transistor are connected to two points of the current path and a series of the transistors having such a parallel relation to the current path are added to the same group. Namely, one or series of transistors connected in parallel to between two points on the path are added to the same group. Further, the transistor of which a gate is connected to the current path is also added to the same group. Through these procedures, the transistors building up the partial circuit that determines the local signal delay can be batchwise organized into the group.

Moreover, the groups having the common transistor serving as a drive unit of the partial circuit are organized into one aggregation (major group). Namely, the two groups having the common transistor as the drive unit of the partial circuit is set as one major group. This is because the circuit drive unit is common, and hence there is a possibility that the two groups might affect each other.

With the execution of the process of grouping the transistors described above, on the occasion of simulating the characteristics of the semiconductor integrated circuit based on the plurality of combinations of the component parameters, the simulation can be carried out in a way that restrains the number of combinations of the component parameters in the design target semiconductor circuit to a proper number of combinations. Besides, substantially the all-inclusive combinations presumed are given to the partial circuit which determines the local signal delay, whereby the circuit layout highly approximate to the optimal configuration can be realized.

<Process of System>

The computer aided design equipment is actualized as one function of, e.g., a CAD (Computer Aided Design) system for designing LSI (Large Scale Integration). The CAD system assumed herein is realized on a general type of computer. The computer includes, e.g., a CPU (Central Processing Unit), a memory, an external storage device (e.g., a hard disk, a driving device for a removable portable recording medium, etc.), an interface with the external storage device, a communication interface, a display device, and an input/output device (e.g., a keyboard, a pointing device such as a mouse, and so on).

The computer aided design equipment is realized by a computer program executed by this type of computer. The computer program is installed into the hard disk via the communication interface or the driving device for the removable portable recording medium. The CPU loads the installed computer program into the memory and then executes the program. The functions of the computer aided design equipment are thereby realized. Further, the computer provides the functions of the computer aided design equipment, whereby a computer aided design method according to the present invention is carried out.

Figure 2:
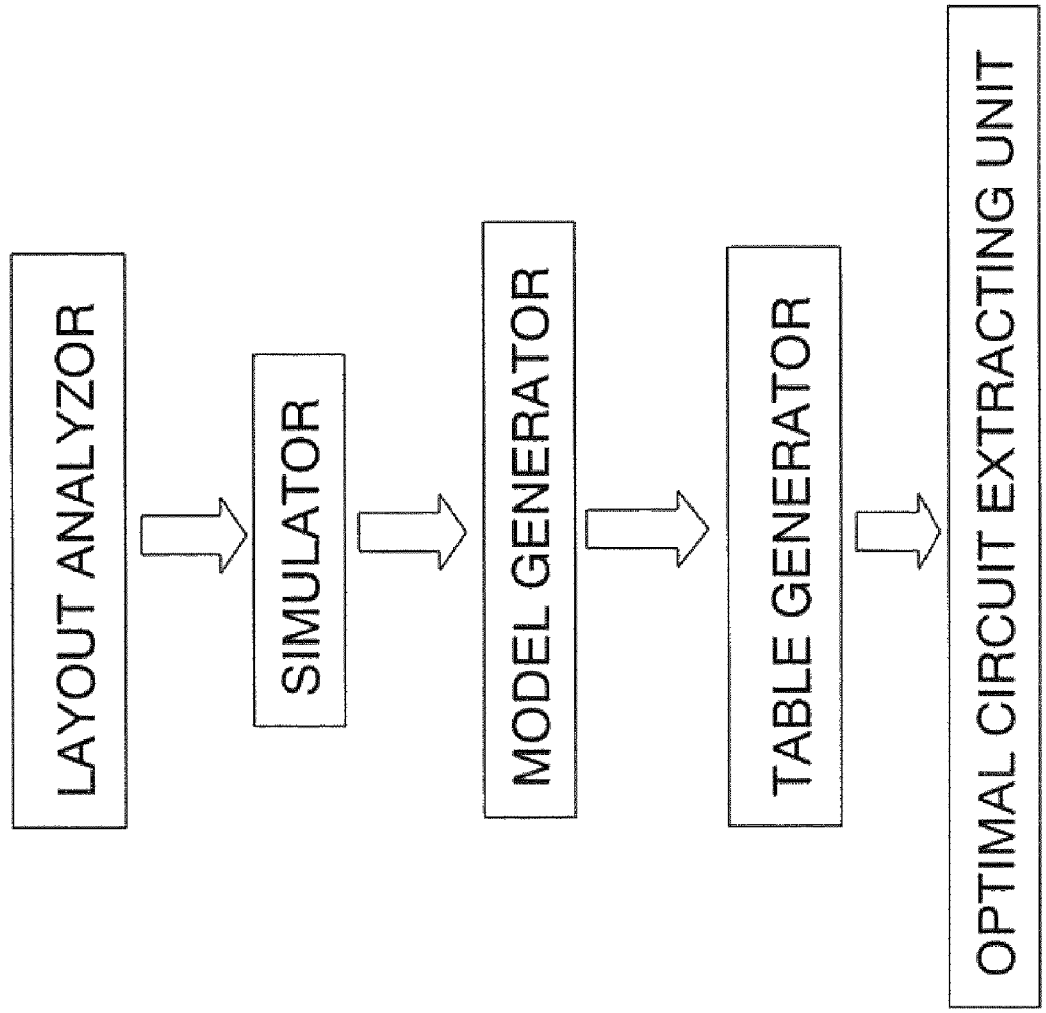
FIG. 2 is a diagram illustrating function blocks of computer aided design equipment.

FIG. 2 illustrates function blocks of the computer aided design equipment. As illustrated in FIG. 2, the computer aided design equipment includes a layout analyzer, a simulator, a model generator, a table generator and an optimal circuit extracting unit. These respective functions are actualized by a computer program developed in a format executable by the CPU on the memory of the computer.

In these parts, the layout analyzer executes modeling of a plurality of characteristic values (which will hereinafter be referred to as transistor characteristic values) of the transistors building up the semiconductor integrated circuit by use of the component parameters, and modeling of a behavior (operation) of the transistor into simulation parameters of the circuit simulator, which can be expressed by the semiconductor circuit simulation.

Moreover, the simulator sets plural combinations of component parameters corresponding to the change in the layout or the physical characteristic of the transistor. Then, the simulator converts the plural combinations of component parameters into plural combinations of simulation parameters according to the model generated by the layout analyzer. Subsequently, the simulator starts up the circuit simulator that simulates the behavior of the semiconductor integrated circuit on the basis of the plural combinations of the simulation parameters, and outputs the individual circuit characteristics.

Namely, the simulator sets the plural combinations of the component parameters corresponding to the change in the layout (the changes in the physical characteristics such as the mobility in terms of the design and the threshold value as the case may be). Then, the simulator converts the component parameters into simulation parameters, and executes the circuit simulation. As a result, there are obtained the circuit characteristics about the plurality of layouts (different mobilities in design, threshold values and physical characteristics as the case may be). Herein, the circuit characteristic is a characteristic that should become an index of performance of the semiconductor circuit, such as the power consumption, the delay time, etc of the semiconductor circuit including the plurality of transistors. It is noted, contrariwise, the simulator, to begin with, sets the plurality of combinations of the simulation parameters and executes the circuit simulation, and, while on the other hand, the same result is acquired even by converting the combinations of the simulation parameters into the plurality of combinations of the component parameters.

The model generator (obtaining a first mapping relation) models the plurality of circuit characteristics of the semiconductor integrated circuit with the component parameters on the basis of the plurality of simulation results. Herein, the term "modeling" connotes obtaining a mapping relation from the component parameters to the characteristics of the semiconductor integrated circuit. For example, this mapping relation (a first mapping relation) is a polynomial in which the component parameters are variables.

The table generator (a calculating values) calculates the circuit characteristics from the plurality of combinations based on the change in the layout or the physical characteristic parameter by use of the thus-generated model (the first mapping relation) representing the characteristics of the semiconductor integrated circuit. Then, the table generator tabularizes the relations between the plurality of combinations of the component parameters and the circuit characteristics. Namely, the memory is stored with a table containing associations of the plural combinations of the component parameters with the circuit characteristics.

In the case of calculating the circuit characteristics by using the model (the first mapping relation) representing the characteristics of the semiconductor integrated circuit, the multiplicity of circuit characteristics can be calculated in a shorter period of time than by executing the simulation. Accordingly, once the model is generated, the circuit characteristics, which are by far more circuit characteristics than by the simulation, can be acquired.

Then, the optimal circuit extracting unit executes, based on a plurality of restriction conditions, screening a part of records (selecting a part of values) from the table stored in the memory, and presenting the optimal layout and the in-design physical characteristics from the remaining records (the combinations of the component parameters) and prompting a user to make a selection (obtaining component parameters and the design patterns corresponding to the component parameters, or the in-design physical characteristics of the transistors corresponding to the component parameters). Each of the function blocks of the computer aided design equipment will hereinafter be explained.

(Layout Analyzer)

Figure 3:
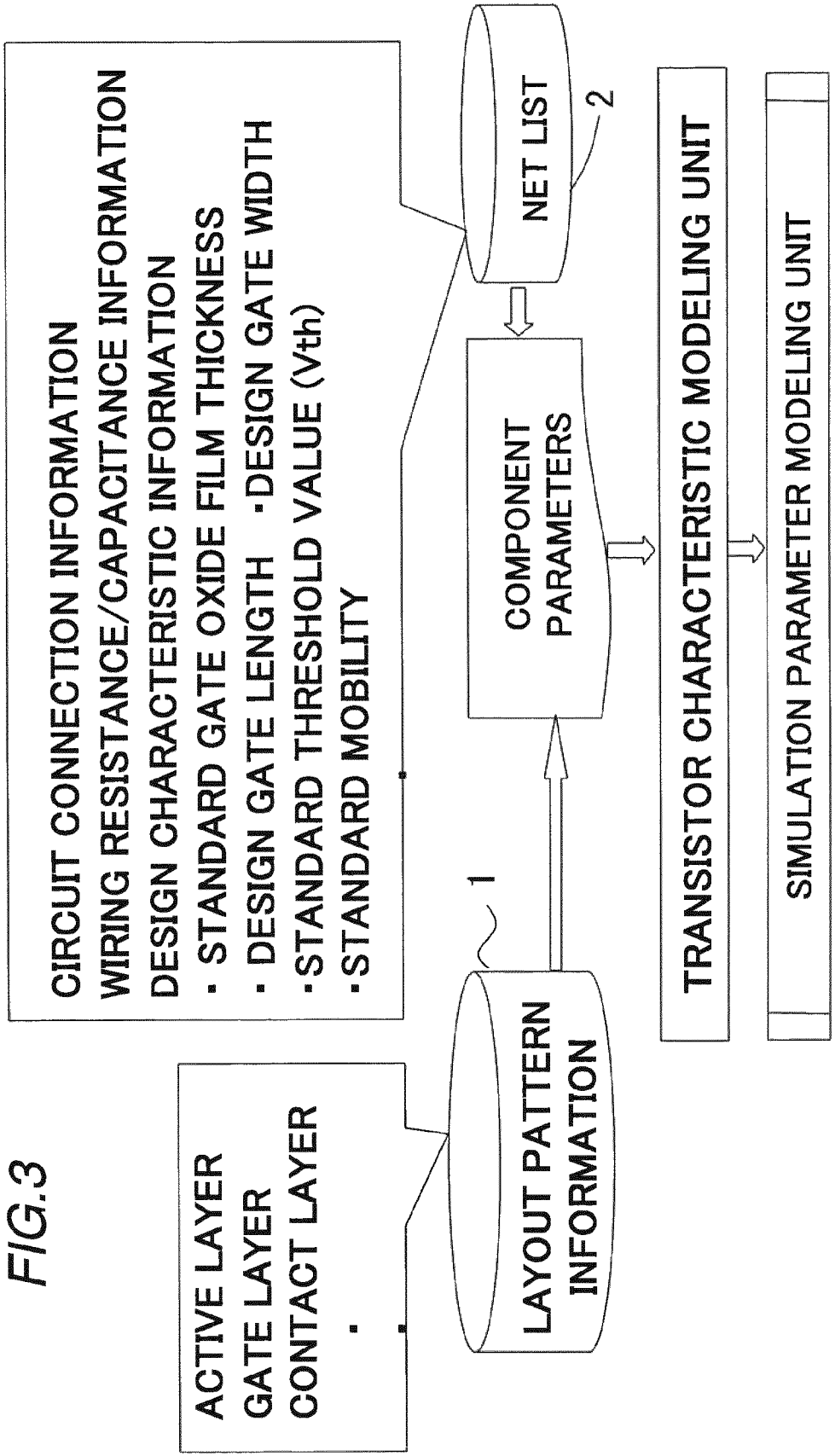
FIG. 3 is a diagram illustrating an outline of a layout analyzer.

FIG. 3 illustrates an outline of the layout analyzer. In the embodiment, the layout analyzer includes a transistor characteristic modeling unit that generates the model (the polynomial) when generating the transistor characteristic value from the layout pattern information 1 and the net list 2, and a simulation parameter modeling unit that generates the model when converting the transistor characteristic value into the simulation parameter.

The transistor characteristic modeling unit extracts the component parameters from the layout pattern information 1 of the transistor and from the net list 2, and calculates, from the component parameters, the transistor characteristic value of the transistor that is actually manufactured. Herein, the layout pattern information 1 of the transistor has pieces of information on the pattern shapes for defining individual elements such as an active layer, a gate layer and a contact layer. Further, the net list 2 has mainly circuit connection information for establishing an element-to-element connection. Still further, the net list 2 has wiring resistance information, capacity information and design characteristic information. Moreover, the transistor characteristic value represents the characteristic of each individual transistor, which is determined from a current-voltage characteristic of the transistor. The transistor characteristic value is separately specifically explained with reference to FIG. 6.

Figure 4:
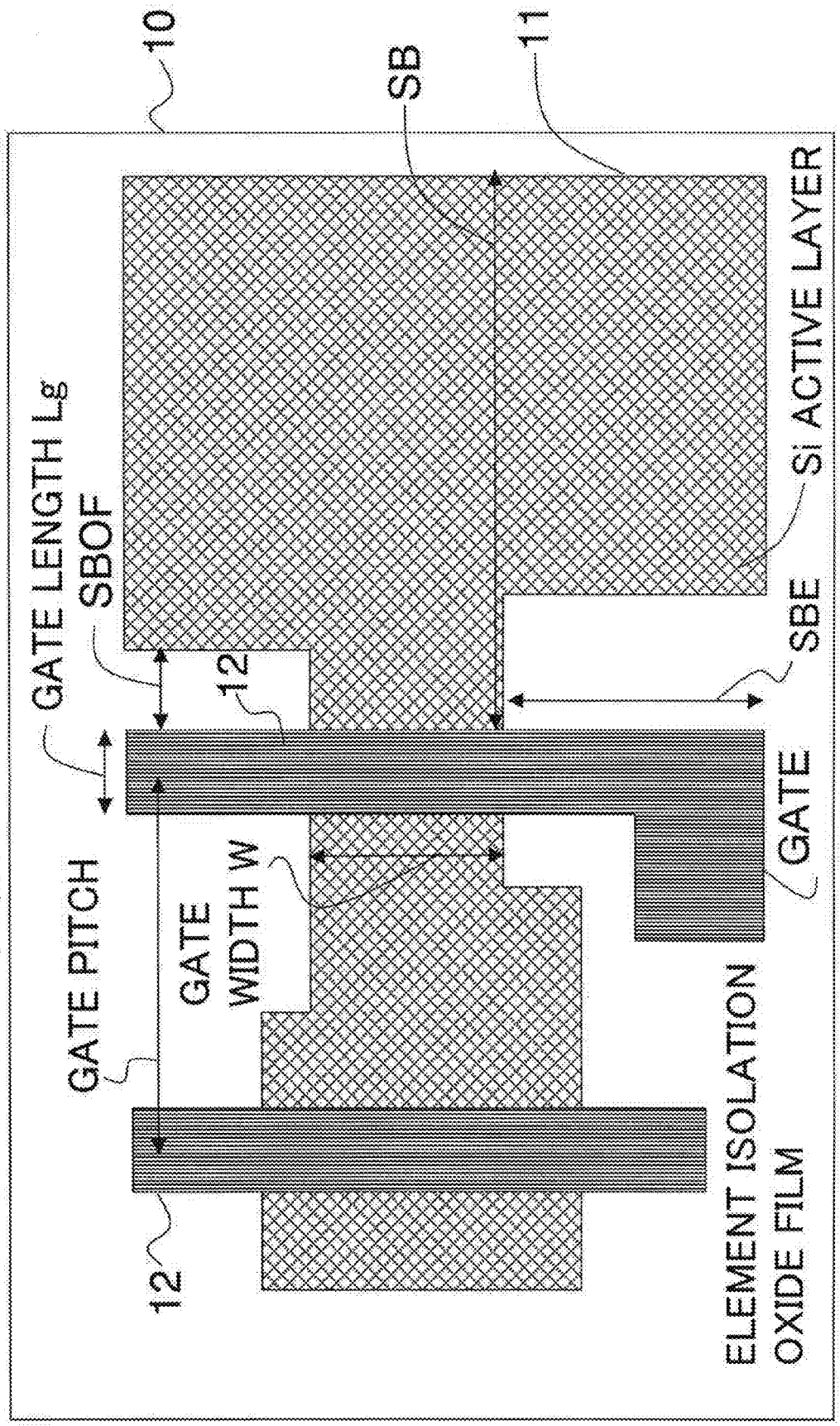
FIG. 4 is a diagram illustrating an example of component parameters.

FIG. 4 illustrates an example of the component parameters extracted from the layout pattern information 1. In FIG. 4, a Si active layer 11 for forming a source/drain and a gate 12 are formed in an element region 10 sectioned by an element isolation film (e.g., STI (Shallow Trench Isolation)). Graphic patterns of the respective components of this type of transistor are defined as the layout pattern information 1. On the other hand, the component parameters represent dimensions of specified elements of the layout pattern information 1. A gate length Lg is a dimension of the gate in a source/drain direction, and a gate width W is a dimension in which the gate extends across the source/drain region.

Other component parameters used are, e.g., a gate pitch, SB (a source/drain width, i.e., a width of the source region or a width of the drain region), SBOF (a source/drain STI offset, i.e., an offset distance of the source region from a gate, or an offset distance of the drain region from the gate), SBE (a source/drain STI offset length, i.e., a dimension of the offset region in a direction orthogonal to the offset direction), etc. The gate pitch is an interval between the gates 12 and 12. The SB is a dimension from one gate 12 to an edge of the source or the drain. The SBOF is a width of a gap formed between the gate 12 and the Si active layer 11, and the SBE is a length of the gap.

The component parameters may, however, include the physical characteristic parameters for specifying the in-design physical characteristics such as the design characteristic information defined in the net list 2. The design characteristic information contains, e.g., a standard gate oxide film thickness, a design gate length, a design gate width, a standard threshold voltage (Vth), a standard mobility (which will hereinafter simply be referred to as standard values), etc. Herein, the standard gate oxide film thickness, the design gate length, the design gate width, etc are values that should be said to be target values (design values) at a design stage. The semiconductor manufacturing process includes difficulty of forming the patterns on the semiconductor substrate as the design value specify, and there is a case in which the design values are discrepant from the values of the components actually manufactured by the semiconductor process. This being the case, the terminologies such as a real gate length and a real gate width are used in a sense of measured values of the components actually formed on the semiconductor substrate when the circuit is manufactured according to the design values.

Then, the acquisition of the precise simulation result entails not performing the simulation in a way that simply reflects the design characteristic information as it is but taking actual influence of the manufacturing process into consideration.

Then, the transistor characteristic modeling unit in FIG. 3 extracts the component parameters from the layout pattern information 1 and the net list 2, and converts the component parameters into the transistor characteristic values of the transistor that is actually manufactured.

In the embodiment, the relation between (a) the component parameters extracted from the layout pattern information 1 and from the net list 2 and (b) the transistor characteristic values based on the manufacturing result, is previously modeled and thus obtained. This relation corresponds to a second mapping relation. This modeling process is executed offline separately from the designing process and the manufacturing process. The second mapping relation from the component parameters to the transistor characteristic values is acquired through this modeling process.

The modeling process may be based on a multiple linear regression analysis. A specific procedure of the multiple linear regression analysis will be explained in the item "Simulation Parameter Modeling Unit". Herein, plural combinations of component parameters (each combination includes, e.g., the standard oxide film thickness, the design gate pitch, the design gate length, the design gate width, the standard threshold value, the standard mobility, etc) are generated, and the characteristic values (Ids, Vth, etc) of the transistors manufactured based on the component parameters are empirically measured. Then, the transistor characteristic values (Ids, Vth, etc) are modeled with the polynomial in which the variables are the respective elements organizing the combination of component parameters (characteristic information such as the standard oxide film thickness, the design gate pitch, the design gate length, the design gate width, the standard threshold value and the standard mobility).

The simulation parameter modeling unit models the simulation parameters with the polynomial of the transistor characteristic values. A third mapping relation from the transistor characteristic values to the simulation parameters is acquired through this modeling process. Then, the third mapping relation is applied to the second mapping relation acquired by the transistor characteristic modeling unit. To be specific, the polynomial of the second mapping relation is substituted into the variables (the variables of the transistor characteristic values) of the polynomial establishing the third mapping relation. A fourth mapping relation from the component parameters to simulation parameters 4 is thereby acquired.

An in-depth description of the simulation parameter modeling unit will hereinafter be made based on the drawings in FIGS. 5 through 9.

The simulation parameter modeling unit is given the characteristic values of the transistors building up the circuit, and provides a function of obtaining parameters (the simulation parameters) of a simulation program that simulates the circuit components.

Example of Simulation Parameters

The simulation parameters are different depending on the simulation program. Typically, the simulation parameters are a threshold value (Vth0) of a long channel, a saturation velocity (VSAT), a mobility (U0), a gate length (Lg), a gate width (W), dependency of the threshold value upon the drain voltage, a floating body effect, an under-the-gate penetrating diffusion length, etc.

Note that the simulation parameters may also be parameters into which to express differences from reference values of the parameters such as the threshold value (Vth0) of the long channel, the saturation velocity (VSAT), the mobility (U0), the gate length (Lg), the gate width (W), the dependency of the threshold value upon the drain voltage, the floating body effect and the under-the-gate penetrating diffusion length, or to express quantities of variations thereof by use of a ratio. Namely, any inconvenience may not be caused by defining deviation quantities from respective standard parameter values in the standard transistors. These parameters are determined for every simulation program.

Among those parameters, the gate length (Lg), the gate width (W), etc are physical quantities corresponding to a gate length and a gate width in the net list. There might be, however, a case in which it is not appropriate that the simulation parameters include using the parameters corresponding to the design data and using the design data as it is.

When film formation, photolithography, etching, etc are conducted based on the design data, a shape and dimensions of a pattern on a substrate are not necessarily coincident with the shape and the dimensions of the design data. Accordingly, the simulation parameters need setting values that reflect a physical shape formed on the substrate in order to acquire a result of the precise circuit simulation.

Further, the simulation parameters include the parameter such as the threshold value (Vth0) of the long channel that does not correspond to the design data or the transistor characteristic as the design value. The threshold value (Vth0) of the long channel connotes a threshold value when the channel length is sufficiently large, and represents a parameter that can not be set as the transistor characteristic at the gate length of the circuit to be designed in actuality.

Moreover, the saturation velocity (VSAT) is the parameter specifying a degree to which a rule that a velocity of electrons is proportional to an electric field with the mobility serving as a proportional coefficient is not established. There is no existence of any guideline showing what value should be set in such a parameter (alternatively, it is also said that sufficiently proper values can not be set only with the SPICE simulation). In the embodiment, as will hereinafter be described, the relation between the transistor characteristic values and the simulation parameters described above is modeled.

Figure 5:
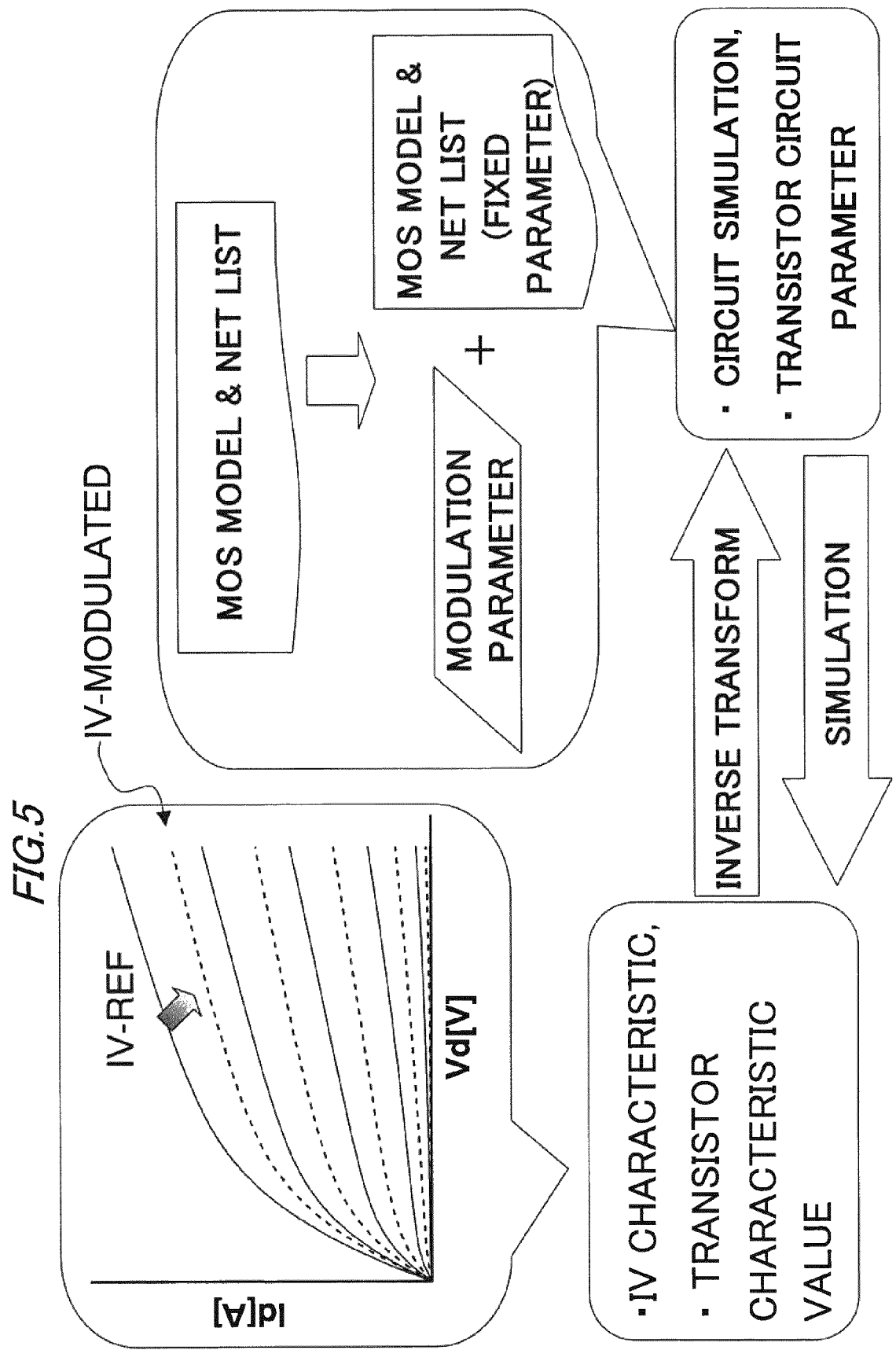
FIG. 5 is a diagram illustrating a first process of modeling transistor characteristic values with simulation parameters based on a circuit characteristic simulation.

FIG. 5 is a diagram illustrating a first process (depicted by "simulation" in FIG. 5) of modeling the transistor characteristic values with the simulation parameters on the basis of the circuit characteristic simulation, and illustrating a second process (depicted by "inverse transform" in FIG. 5) of modeling the simulation parameters with the transistor characteristic values. In the embodiment, the second process of modeling the simulation parameters with the transistor characteristic values includes solving inversely the model formula acquired in the first process or alternatively performing the modeling by inverse transform.

Thus, there exist a tremendous number of simulation parameters, which can be set when executing the circuit characteristic simulation. The computer aided design equipment classifies, based on setting given from the user, the multiplicity of simulation parameters into the parameters (illustrated as "modulation parameters" in FIG. 5) in which set values should be changed and into the parameters (referred to as "fixed parameters") in which fixed values are set. It is noted, in the following discussion, the modulation parameter is simply termed the simulation parameter.

Then, the computer aided design equipment executes a circuit characteristic simulation program about multiple combinations of plural simulation parameters. Through this execution, transistor characteristic information (which is also called signal characteristics) about each combination of simulation parameters is obtained. The transistor characteristic information is obtained as a current/voltage characteristic between the source and the drain when, e.g., the gate voltage is fixed. Further, the transistor characteristic information is obtained as a gate voltage/drain current characteristic when the drain voltage is fixed. These transistor characteristics are acquired as, for example, the combination of the gate voltage, the drain voltage and the drain current (Vgi, Vdi, Idi, where i is an integer). Generally, the transistor characteristic information can be said to be a characteristic of a curve representing a relation between the electric current or the voltage inputted to one terminal of the transistor and the electric current or the voltage measured at the same terminal as one terminal or at the other terminal of this transistor.

Then, the computer aided design equipment extracts a value which will hereinafter be called transistor characteristic value that characterizes the transistor characteristic information from the acquired transistor characteristic information. This value is, e.g., the drain current when the gate voltage Vg and the drain voltage Vd take the predetermined values. Further, this value is, for example, a mutual conductance obtained as a ratio of a quantity of variation in the drain current to a quantity of variation in the gate voltage when the drain voltage is set to the predetermined value in a linear region.

The computer aided design equipment extracts a plurality of these transistor characteristic values. Then, the computer aided design equipment records a relationship between the combination of the simulation parameters and the combination of the acquired transistor characteristic values. Subsequently, when acquiring the combination of transistor characteristic values with respect to the plural combinations of the simulation parameters, the mapping relationship to the transistor characteristic values from the simulation parameters is obtained. It may be sufficient that the mapping relationship expresses the transistor characteristic values in, e.g., the polynomial expression of the simulation parameters. The polynomial expression can be obtained by performing, e.g., the multiple linear regression analysis.

The multiple linear regression analysis is an analyzing method of fitting a value which is also called a response variable in the polynomial expression to the characteristic value to be acquired in a way that determines a coefficient in the term of independent variables with a plurality of variation quantities being set as the independent variables. The term of the polynomial expression is generally equal to or higher than being linear and may contain a product of a plurality of variables. Normally, the coefficient is determined so as to minimize errors between the object characteristic value and the value of the polynomial expression in predetermined domains of the independent variables. Note that an operation of acquiring a formula for predicting one response variable with one independent variable is called a simple linear regression analysis, and this formula can be obtained by a least square method. As broadly known, in the least square method, the coefficient of the formula is determined to minimize a sum of squares of errors between the response variables and actual values. The multiple linear regression analysis is what this is extended to the plurality of variables.

For example, the description will be made by exemplifying a case in which the polynomial expression is Y=F (x1, x2, ..., xn), where F (x1, x2, ..., xn) is the polynomial expression of x1, x2, ..., xn. For example, the polynomial expression is given such as F (x1, x2, ..., xn)=a0+a1·x1+, ..., +am·x1·...·Xn.

In this case, with respect to a combination Yi, x1$i$, x2$i$, ..., xni, where i is the integer, of the actual values of the independent variables x1, x2, ..., xn and the response variable Y, the error is defined by ERROR=(Yi−F(x1, x1$i$, x2$i$, ..., xni))2, and a coefficient a0, ..., am is determined so as to minimize the error.

Generally, this error is partially differentiated by each coefficient a0, ..., am, and the minimum value is determined. The error is given in the quadratic equation of the coefficient a0, ..., am, and hence it becomes the linear equation after being partially differentiated. Accordingly, the operation of obtaining the error minimized resolves itself into solving a simultaneous equation. A solution of the linear equation on the computer is well known, and hence its explanation is omitted.

It follows that the relationship between the simulation parameters and the transistor characteristic values is acquired by executing the program for processing this type of multiple linear regression analysis.

Once the transistor characteristic values are expressed by the polynomial expression of the simulation parameters, the computer aided design equipment inversely transforms the simulation parameters into the polynomial expression of the transistor characteristic values. This is a process of solving the simultaneous equation organized by the combinations of the plural transistor characteristic values expressed in the polynomial expression of the simulation parameters. As a result, the computer aided design equipment, when the transistor characteristic values are obtained, immediately can acquire the simulation parameters. Accordingly, the simulation of the circuit characteristic can be immediately executed.

Figure 6:
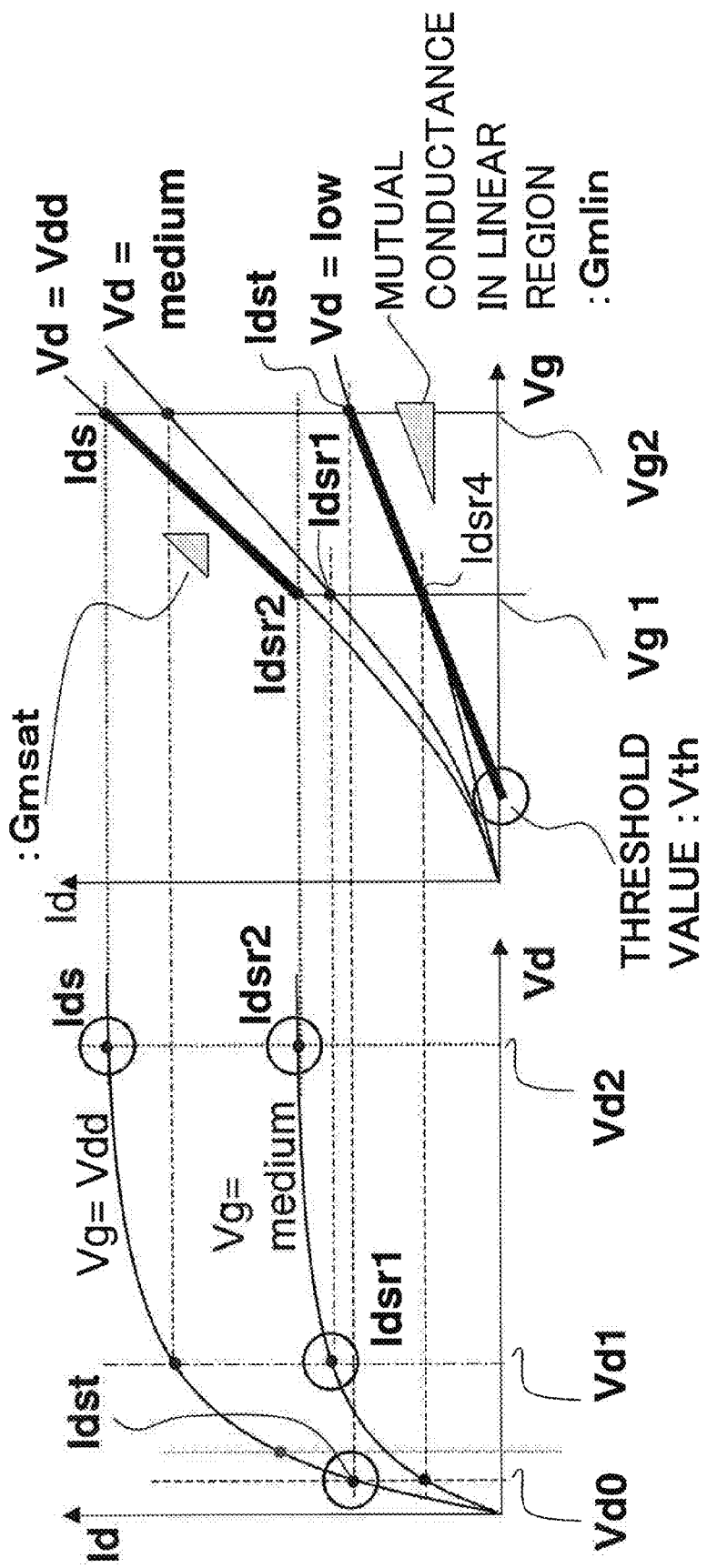
FIG. 6 is a diagram illustrating an example of the transistor characteristic values.

FIG. 6 illustrates an example of the transistor characteristic values. This example illustrates, as the transistor characteristic information, the relationship between the drain voltage Vd and the drain current Id when the gate voltage Vg is fixed and the relationship between the gate voltage Vg and the drain current Id when the drain voltage Vd is fixed.

In FIG. 6, the current/voltage characteristic of the single transistor is expressed by a curve. What is actually obtained by the simulation is a combination of discrete values of the gate voltage Vg, the drain voltage Vd and the drain current Id. The transistor characteristic value is the value that characterizes the current/voltage characteristic of the single transistor, and is prescribed by a value itself, a gradient, an intercept, a tangential line, etc at a specified point of the current/voltage characteristic. The characteristic values used by the computer aided design equipment will hereinafter be exemplified.

It is feasible to exemplify the drain current value Id with respect to the specified drain voltage Vd when the gate voltage Vg is fixed. For example, the transistor characteristic values include using (Vd0, Idst), (Vd2, Ids) when fixed to Vg=Vdd and (Vd1, Idsr1), (Vd2, Idsr2) when fixed to Vg=medium value ("medium" in FIG. 3).

When the drain voltage is fixed, the mutual conductance in the linear region is exemplified. For instance, a ratio of $\Delta Vg=Vg2-Vg1$ to $\Delta Id=Ids-Idsr2$ in the saturation region when fixed to Vd=Vdd, is calculated as the mutual conductance in the saturation region. The calculation of the ratio given by $\Delta Id/\Delta Vg$ corresponds to a predetermined arithmetic operation.

The threshold value of the transistor can be exemplified. For example, the drain current when under at least one gate voltage (Vgs) applying condition (where the source/drain voltage Vds=fixed, a substrate bias Vbs=0) under the linear region condition and the threshold value under the linear region condition, can be exemplified as the transistor characteristic values. The threshold value can be, as illustrated in FIG. 3, calculated as an intersection Vth between the axis of abscissa (Vg-axis) and a tangential line of Vg1 at such a point as to maximize a micro increment quantity (the tangential line representing a gradient) of the drain current with respect to a quantity of micro variation of the gate voltage on the gate voltage/drain current characteristic curve when the drain voltage is fixed. Further, for example, when Vd=low, an intersection with the Vg-axis of the tangential line at a point (Vg1, Idsr4) is calculated as the threshold value Vth. The calculation of this threshold value corresponds to a predetermined arithmetic operation.

The drain currents can be exemplified when under at least two types of gate voltage applying conditions (where Vbs=0) with the same drain voltage under the saturation region condition. Namely, the drain currents can be defined as (Vg1, Ids2), (Vg2, Ids) on the same gate voltage/drain current characteristic curve. In this case, the drain voltage is set to the power source voltage Vdd, the gate voltage is the power source voltage Vdd, and at least one of other gate voltages may be set equal to or smaller than ½ of a sum of the power source voltage Vdd and the threshold value.

The drain currents when under at least two types of drain voltage applying conditions (where Vbs=0) with the same gate voltage under the saturation region condition, may also be available. In this case, the gate voltage may be set equal to or smaller than ½ of the sum of the power source voltage Vdd and the threshold value.

Under the voltage conditions (3) through (5) among the conditions given above, the drain current when a predetermined value is set in a body voltage Vbs (which is also referred to as a substrate bias) may also be used.

A combination of the characteristic values under the conditions (3) and (4) among the conditions given above may also be used. Namely, there may be set, as the available characteristic values, a combination of the drain current when under at least one gate voltage (Vgs) applying condition where the source/drain voltage Vds=fixed, and the substrate bias Vbs=0, under the linear region condition, the threshold value under the linear region condition, the drain current when under at least two types of gate voltage applying conditions (where Vbs=0) with the same drain voltage under the saturation region condition and the drain currents when under at least two types of drain voltage applying conditions (where Vbs=0) with the same gate voltage under the saturation region condition.

Further, a combination of the conditions (3), (4) and (5) may also be employed. Namely, there may be set, as the available characteristic values, a combination of the drain current when under at least one gate voltage (Vgs) applying condition where the source/drain voltage Vds=fixed, and the substrate bias Vbs=0, under the linear region condition, the threshold value under the linear region condition and the drain current when under at least two types of gate voltage applying conditions (where Vbs=0) with the same gate voltage under the saturation region condition.

Moreover, a combination of the conditions (3), (4), (5) and (6) may also be employed. Namely, the combinations given above may be further combined with a value when the substrate bias Vbs=0 and a value when the substrate bias is not 0.

In addition to those described above, the characteristic values may include using the mutual conductance (Gmlin) in the linear region, the drain voltage dependency ($\Delta$th) of the threshold value and the floating body effect. Among these characteristic values, the drain voltage dependency ($\Delta$th) of the threshold value can be defined as, for example, $\Delta th=(Idsr2-Idsr1)/(Idsg2-Idsg1)$, which is a ratio of a difference between the drain current Idsg1 in the case of the gate voltage Vg1 when fixed to Vd=Vdd and the drain current Idsg2 in the case of the gate voltage Vg2 to a difference between the drain current Idsr1 in the case of the drain voltage Vd1 when fixed to Vg=middle value (medium in FIG. 6) and the drain current Idsr2 in the case of the drain voltage Vd2. The calculation of this ratio $\Delta$th corresponds to the predetermined arithmetic operation.

Furthermore, the floating body effect can be defined such as a threshold value variation rate=$(Vth1-Vth2)/(Vbs1-Vbs2)$ when changing the body voltage Vbs. In this case, "Vd" is set as a predetermined value. Note that a change in the mutual conductance may also be used as the floating body effect in place of the threshold value. The calculation of the floating body effect corresponds to the predetermined arithmetic operation. It should be noted that the predetermined arithmetic operation is not limited to the above-described calculations of the mutual conductance, $\Delta$th, the floating body effect, etc.

These characteristic values are calculated by the computer program executed on the computer aided design equipment.

Figure 7:
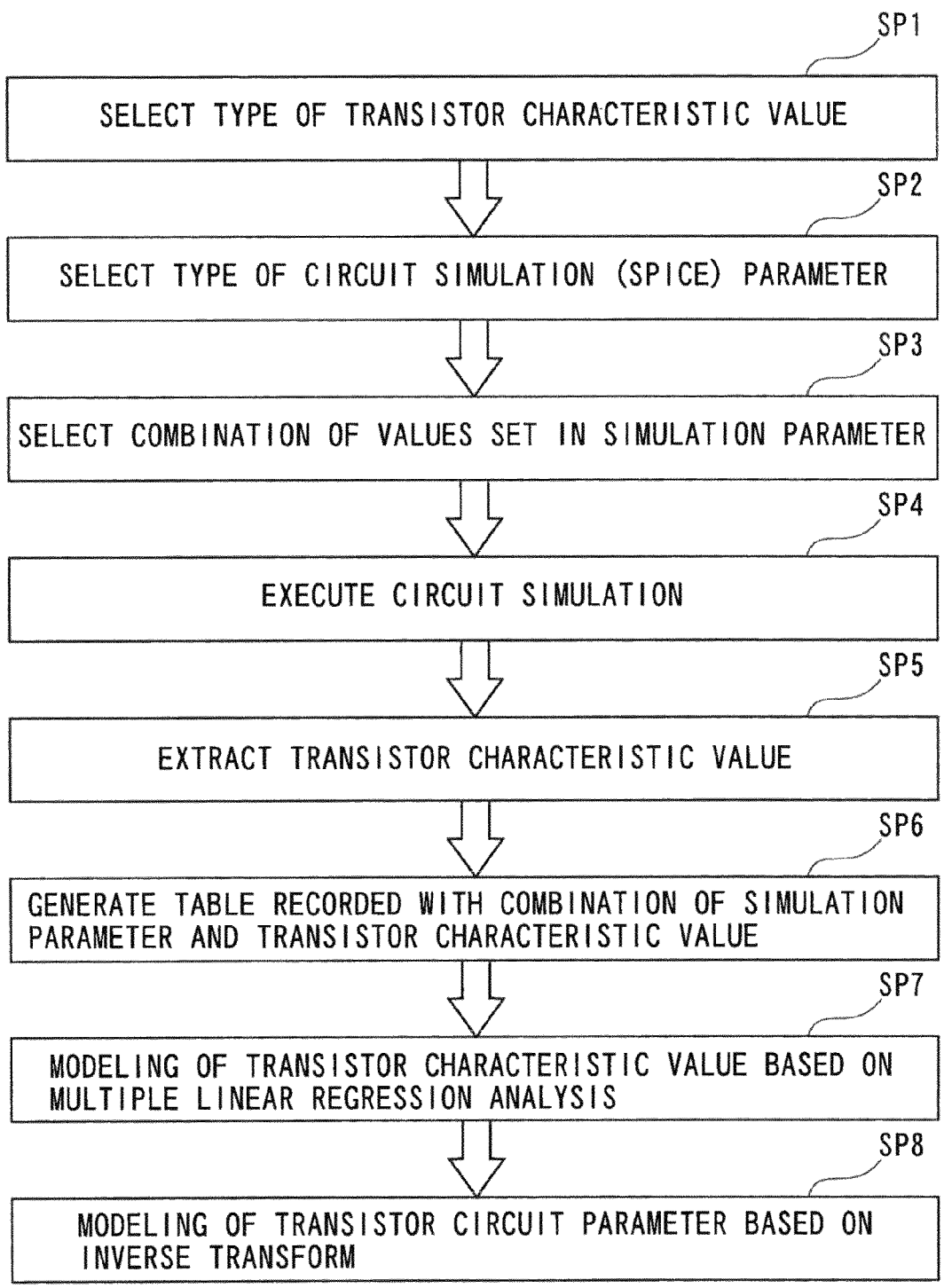
FIG. 7 is a flowchart illustrating a process of modeling the transistor characteristic values and the simulation parameters.

FIG. 7 is a flowchart of a process of modeling the transistor characteristic values and the simulation parameters on the basis of the circuit simulation.

To start with, in SP1, a type of the characteristic value, which should be extracted from the transistor characteristic information, is selected. Herein, in the characteristic values that can be calculated by the characteristic value calculation program of the computer aided design equipment among the plurality of characteristic values including the exemplified values (1)-(8), a characteristic value desired by the user is selected as the characteristic value described above. It is preferable that the number of the characteristic values of the transistor be, if possible, same as the number of the changeable simulation parameters. Further, it is also preferable to select such characteristic values that the transistor characteristic values change as independently as possible to each other when a predicted physical quantity changes.

For example, with respect to a change in a channel impurity concentration and a change in the gate length, when fixed to Vg=medium value ("medium" in FIG. 6) and to the drain voltage=medium value ("medium" in FIG. 6), the drain current Idsr1 changes comparatively independently. On the other hand, the mutual conductance in the linear region has a high correlation with the mobility of the electrons.

Next in SP2, the simulation parameters, for example, the modulation parameters used in the circuit simulation are selected. These parameters are predetermined for every simulation program.

Herein, the simulation parameters that should be modeled in the way of being associated with the transistor characteristic value, for example, the modulation parameters of which the values should be changed are selected from within the multiplicity of parameters. With this selection, it follows that the simulation parameters, which vary with the change in the transistor characteristic value are determined.

Next in SP3, the combination of values, which are set in these simulation parameters, are selected. The computer aided design equipment determines a maximum variation quantity changeable region defined by the minimum value and the maximum value of each of the selected simulation parameters and also determines an interval at which the simulation is conducted, and selects, based on these determined elements, the combination of the simulation parameters. At this time, round-robin combinations of all the simulation parameters may also be set. Alternatively, an optimum combination as the minimum required according to an orthogonal table may also be set based on an experimental design method which is simply called as experimental design. The orthogonal table is an allocation table for an experiment having such a property that all the combinations of the set values of the simulation parameters occur the same number of times with respect to arbitrary two factors which are herein the types of the simulation parameters. In the case of determining the set values at random, the experiments are required to be done a number of times corresponding to at least a product of the numbers of combinations of the set values of the simulation parameters. Accordingly, the number of the experiments reaches to a tremendous number if the number of the simulation parameters increases. The well-known orthogonal method based on the experimental design enables reduction in the number of the combinations by selecting the parameters having a small dependent relationship.

Next, in the computer aided design equipment, the simulation unit 12 executes the circuit simulation per combination (SP4). For example, the SPICE-based simulation is carried out. As a result of the simulation conducted by the simulation unit 12, the combination of the gate voltage Vg, the drain voltage Vd and the drain current Id (Vgi, Vdi, Idi, where i is the integer) is obtained for the simulation parameter designated by the user.

Figure 8:
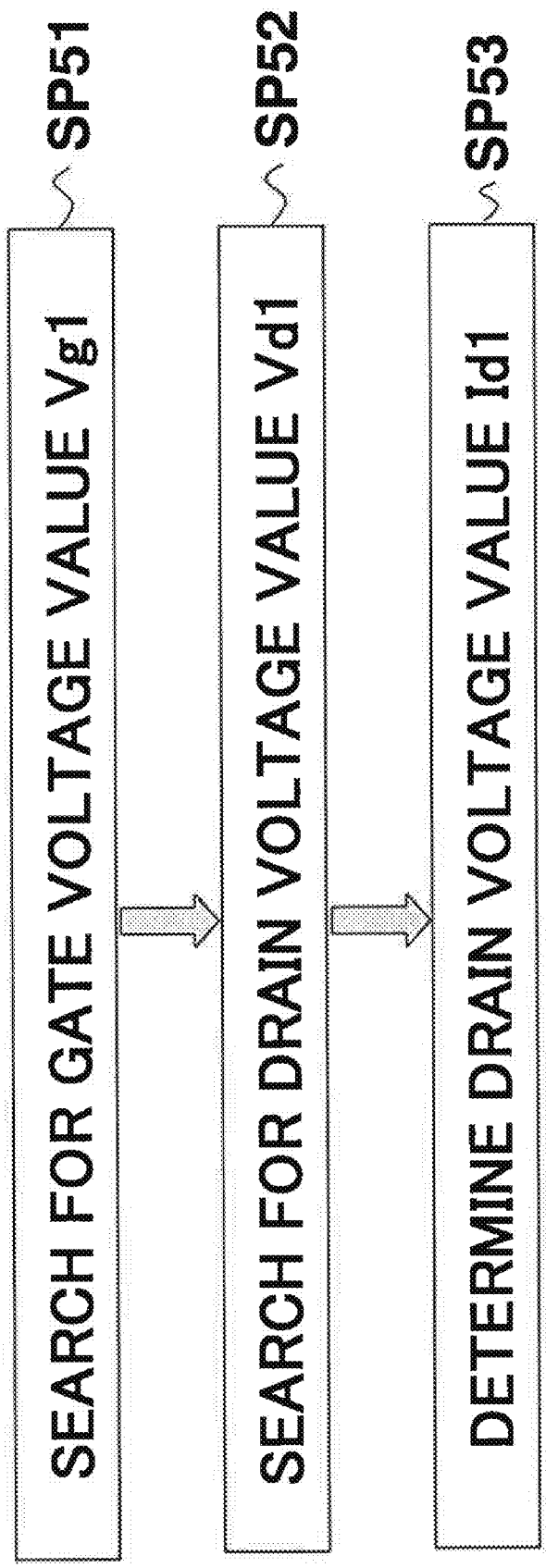
FIG. 8 is a flowchart illustrating a process of obtaining a drain current in relation to a drain voltage when a gate voltage is fixed to a predetermined value.
Figure 9:
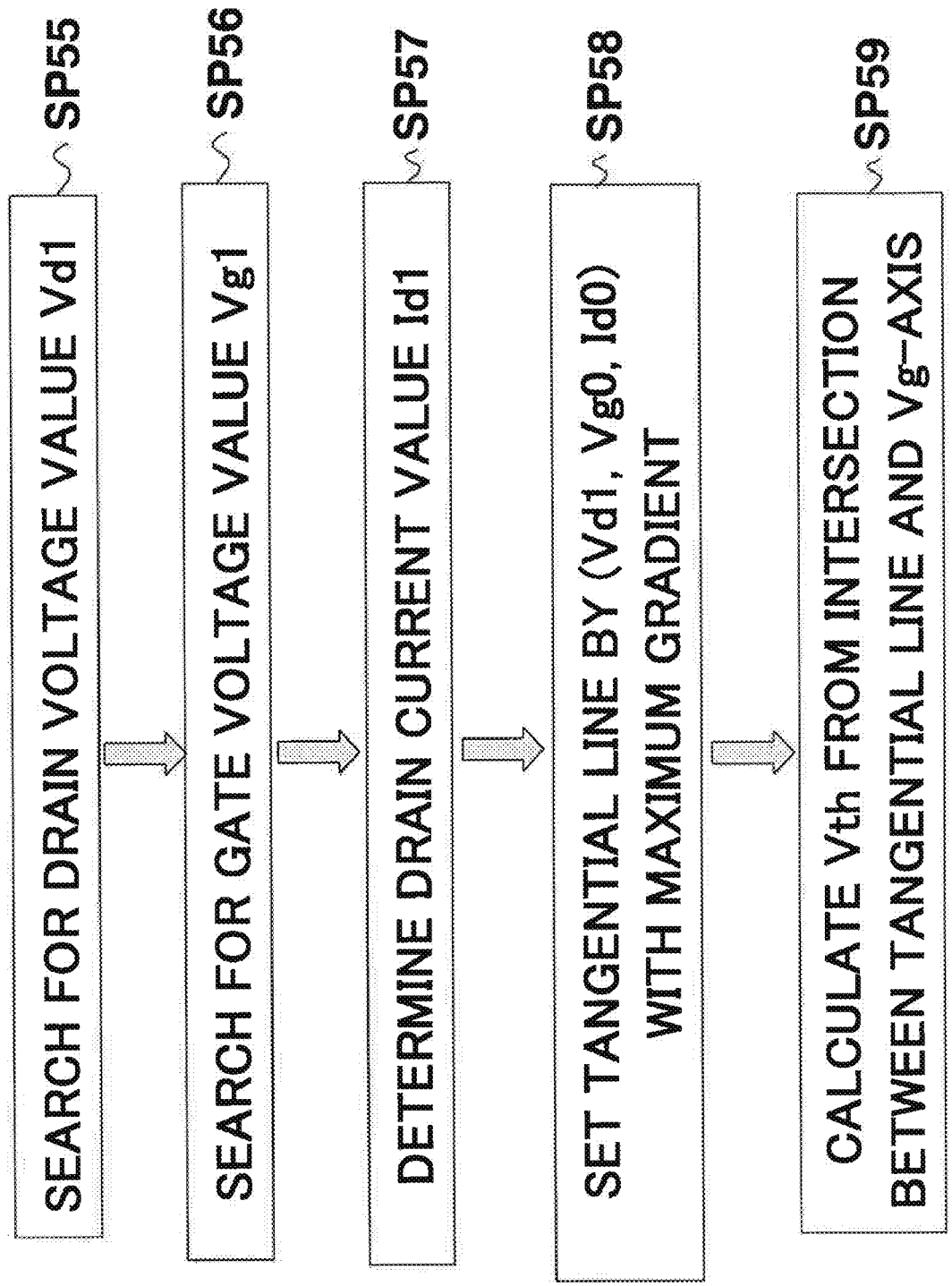
FIG. 9 is a diagram illustrating a process of extracting a threshold value.

Next, the computer aided design equipment extracts the transistor characteristic values selected in SP1 from the transistor characteristic information acquired by the simulation unit 12 (SP5). FIGS. 8 and 9 illustrate examples of the processes of obtaining the transistor characteristic values. FIG. 8 is a flowchart showing a process of obtaining the drain current in regard to the drain voltage Vd1 when the gate voltage is fixed to a predetermined value. In this process, at first, the computer aided design equipment searches the simulation result for the combination containing the gate voltage that takes a predetermined value Vg1. To be more specific, the computer aided design equipment obtains the combinations (Vg1(+ΔVg), Vdi, Idi, where i=1, ..., N) in which a deviation of the gate voltage Vg from the predetermined value Vg1 is equal to or smaller than an allowable value ΔVg among the combinations of Vgi, Vdi, Idi, where i is the integer (SP51).

Next, the computer aided design equipment searches the combinations of Vg1, Vdi, Idi, where i=1, ..., N obtained in SP51 for the combinations containing the drain voltage Vd that takes the predetermined value Vd1 (SP52). More specifically, the computer aided design equipment obtains, from the combinations given above, the combination (Vg1, Vd1, Id1) in which a deviation of the drain voltage Vd from the predetermined value Vd1 is equal to or smaller than an allowable value ΔVd. If a plurality of such combinations is searched for, the combination containing the drain voltage Vd closest to Vd1 is selected.

Then, the drain current value Id1 is determined from the obtained combination (Vg1, Vd1, Id1) (SP53).

FIG. 9 is the flowchart showing a process of extracting the threshold value Vth. Herein, the computer aided design equipment, to start with, searches for the combinations (Vgi, Vdi, Idi, where i=1, ..., M) in which the drain voltage Vd takes the predetermined value Vd1 (SP55).

Next, the computer aided design equipment searches for the combination (Vg1, Vd1, Id1) containing the gate voltage Vg taking the predetermined value Vg1 (SP56). Then, the computer aided design equipment determines the drain current Id (SP57). Further, the computer aided design equipment obtains the combination (Vg2, Vd1, Id2) of the gate voltage Vg2 in which Vg1 is changed by a micro quantity with the same drain voltage Vd1. Through this operation, the computer aided design equipment acquires a gradient a of the tangential line such as a=(Id2−Id1)/(Vg2−Vg1). This operation is executed for a variety of gate voltages Vg, thereby searching for Vg0 and Id0 with the maximum value of the gradient of the tangential line. Then, the computer aided design equipment sets an equation of the tangential line at a point (Vg0, Id0) such as Id−Id0=a·(Vg−Vg0) (SP58). Subsequently, the computer aided design equipment obtains the threshold value Vth from the value of Vg at the point where the tangential line intersects the Vg-axis by setting Id=0 (SP59).

The computer aided design equipment generates, based on the procedures described above, a table in which the plurality of transistor characteristic values is associated with the combination of the simulation parameters (SP6 in FIG. 7).

Next in SP7, the multiple linear regression analysis is conducted based on this table, and the plurality of transistor characteristic values is modeled by the polynomial expression corresponding to a second mapping relationship, where the plural simulation parameters are the variables. For instance, the threshold value Vth defined as the transistor characteristic value can be expressed by use of four simulation parameters such as Vth0, VSAT, U0, Lg in the following formula 1. Herein, the computer aided design equipment executes the procedure of the multiple linear regression analysis, and determines such coefficients a, ai (i is the integer) that the value in the formula 1 fits most to the table value of the characteristic value obtained by the simulation.

$$\begin{aligned}Vth = {}& a + a0*Vth0 + a1*VSAT + a2*U0 + \\& a3*Lg + a4*Vth0*Vth0 + a5*VSAT*VSAT + \\& a6*U0*U0 + a7*Lg*Lg + a8*Vth0*VSAT + \\& a9*Vth0*U0 + a10*Vth0*Lg + \\& a11*VSAT*U0 + a12*VSAT*Lg + a13*U0*Lg\end{aligned} \quad \text{(Formula 1)}$$

Further, the drain current Ids can be similarly expressed by use of Vth0, VSAT, U0, Lg in the following formula 2.

$$\begin{aligned}Ids = {}& b + b0*Vth0 + b1*VSAT + b2*U0 + \\& b3*Lg + b4*Vth0*Vth0 + b5*VSAT*VSAT + \\& b6*U0*U0 + b7*Lg*Lg + b8*Vth0*VSAT + \\& b9*Vth0*U0 + b10*Vth0*Lg + \\& b11*VSAT*U0 + b12*VSAT*Lg + b13*U0*Lg\end{aligned} \quad \text{(Formula 2)}$$

The operation is the same with Idsr1, Idsr2, Idst. Furthermore, other characteristic values such as the mutual conductance, the drain voltage dependency Δth of the threshold value and the floating body effect are designated as the transistor characteristics, in which case values of coefficient of each formula for the characteristic value given above can be similarly obtained.

In next step SP8, the simulation parameters Vth0, VSAT, U0, Lg are described in the polynomial expression, in which Ids, Idsr1, Idsr2, Idst, Vth defined as the transistor characteristic values are the variables. Namely, the polynomial expression of the simulation parameters obtained in SP7 is transformed into the polynomial expression of the transistor characteristic values. At this time, if the number of the simulation parameters is the same as the number of the transistor characteristic values, the polynomial expression of the simulation parameters can be transformed into the polynomial expression of the transistor characteristic values by solving the simultaneous equation.

Further, for example, the multiple linear regression analysis is performed by using again the table generated in SP6, and the respective simulation parameters may be modeled by the polynomial expression of the plurality of transistor characteristic values. Moreover, if a bias exists in the combination of Ids, Idsr1, Idsr2, Idst, Vth, etc in the table generated in SP6, the transistor characteristic values based on the combination of the simulation parameters may be calculated newly by use of the polynomial expression employed for the modeling in SP7. Then, the multiple linear regression analysis is carried out by adding the results of these operations, and the simulation parameters may be modeled with the plurality of transistor characteristic values. For example, the simulation parameter Vth0 can be expressed in the following formula 3 by employing the five transistor characteristic values such as Ids, Idsr1, Idsr2, Idst, Vth.

$$Vth0 = \quad \text{(Formula 3)}$$
$$d + d0*Ids + d1*Idsr1 + d2*Idsr2 + d3*Idst + d4*Vth +$$
$$d5*Ids*Ids + d6*Idsr1*Idsr1 + d7*Idsr2*Idsr2 +$$
$$d8*Idst*Idst + d9*Vth*Vth + d10*Ids*Idsr1 +$$
$$d11*Ids*Idsr2 + d12*Ids*Idst + d13*Ids*Vth +$$
$$d14Idsr1*Idsr2 + d15Idsr1*Idst + d16*Idsr1*Vth +$$
$$d17Idsr2*Idst + d18*Idsr2*Vth + d19*Idst*Vth$$

Moreover, the mobility U0 can be expressed similarly to Vth0 in the following formula 4 by using Ids, Idsr1, Idsr2, Idst, Vth.

$$U0 = \quad \text{(Formula 4)}$$
$$e + d0*Ids + e1*Idsr1 + e2*Idsr2 + e3*Idst + d4*Vth +$$
$$e5*Ids*Ids + e6*Idsr1*Idsr1 + e7*Idsr2*Idsr2 +$$
$$e8*Idst*Idst + e9*Vth*Vth + e10*Ids*Idsr1 +$$
$$e11*Ids*Idsr2 + e12*Ids*Idst + e13*Ids*Vth +$$
$$e14Idsr1*Idsr2 + e15Idsr1*Idst + e16*Idsr1*Vth +$$
$$e17Idsr2*Idst + e18*Idsr2*Vth + e19*Idst*Vth$$

If other parameters, e.g., the gate width W, the gate length L, the under-the-gate penetrating diffusion length and the floating body effect are selected as the simulation parameters, the procedure of the multiple linear regression analysis remains unchanged. The steps described above enable the simulation parameters to be modeled with the transistor characteristic values In the process of SP7, the plurality of transistor characteristic values is modeled by the polynomial expression of the plurality of simulation parameters. As a substitute for the polynomial expression, the relationship between the simulation parameters and the transistor characteristic values can be also expressed by a weighted sigmoid function based on a neurolearning analysis. The neurolearning is that plural elements called neurons are combined to organize a mapping relationship to output signals from input signals. In the mapping relationship in this case, the output signal is generated by a non-linear function to which each input signal is weight-added. The sigmoid function is used as the non-linear function in this case.

The neurolearning analysis includes connecting, e.g., the combination of the transistor characteristic values to an input of a neural network. Then, the combination of the simulation parameter values is set as a teaching signal. The teaching signal connotes a signal that is desirable as the output signal in the neural network. Then, a weight for the weight-addition is determined so as to minimize a squared error between the output signal and the teaching signal in the neural network. A procedure of determining this weight is called the neurolearning. In the neurolearning, normally, a weight coefficient is determined in a direction tracing back to the input side from the output side. For example, Japanese Patent Application No. 3110434 proposes an example of the neurolearning and an example of a circuit for realizing the network thereof.

(Simulator)

FIG. 10 is a flowchart exemplifying a process by the simulator. Illustrated herein are a method of how the component parameters are combined and a simulation executing method when simulating the characteristics of the semiconductor integrated circuit on the basis of the plural combinations of component parameters.

Herein, the computer aided design equipment at first organizes a plurality of groups each including the plurality of transistors selected from the transistors in the design target circuit (SS1). The step SS1 corresponds to organizing the plurality of transistors. Next, the computer aided design equipment generates a table for every group, in which elements are the component parameters of the transistors (SS2).

Subsequently, the computer aided design equipment selects one arbitrary group from the plurality of groups (SS3). The step SS3 corresponds to a selecting any selection group. The selected group consists of the transistors of which the component parameters are to be changed by simulation. This group is called a target group.

Next, the computer aided design equipment sets specified parameter values in non-selected groups other than the target group (SS4). Herein, a phrase "setting the specified parameter values" connotes "setting the parameter values that are unchanged but fixed". The step SS4 corresponds to setting fixed parameter values.

Then, the computer aided design equipment executes the circuit characteristic simulation based on the combinations of component parameters with respect to the target group (SS5). The step SS5 corresponds to setting combinations of the component parameters, executing the simulation, and acquiring circuit characteristics. The circuit characteristic simulation includes inputting the simulation parameters to the circuit simulator by which the circuit characteristics (delay time, power consumption, a leak current, etc of the circuit) of the whole circuit including the plurality of transistors are calculated. The circuit characteristic simulation (e.g., the SPICE simulation) itself is broadly known, and hence its description is omitted.

The computer aided design equipment, however, to begin with, after converting the combinations of the component parameters into the combinations of the simulation parameters, executes the circuit characteristic simulation. Then, the plural combinations of the component parameters are converted into the plural combinations of the transistor characteristic values of the transistor, which is actually manufactured, with the polynomial (the second mapping relation) generated by the transistor characteristic modeling unit. Further, the plural combinations of the transistor characteristic values are converted into the plural combinations of the simulation parameters with the polynomial (the third mapping relation) generated by the simulation parameter modeling unit.

A fourth mapping relation for calculating the simulation parameters from the component parameters may, however, be obtained by applying the second mapping relation to the third mapping relation. In this case, the plural combinations of the simulation parameters can be acquired directly from the plural combinations of the component parameters according to the fourth mapping relation. Then, the computer aided design equipment carries out the circuit simulation by use of the plural combinations of the thus-acquired simulation parameters. The process of acquiring the plural combinations of the simulation parameters from the plural combinations of the component parameters according to the fourth mapping relation, corresponds also to converting component parameters.

Moreover, the computer aided design equipment selects the groups excluding the group that has already been set as the target group, and repeatedly executes the steps SS4 and SS5. Thus, the circuit simulation is executed in a way that sequentially changes the target group. Through these procedures, an extreme rise in the number of layout combinations of the transistors in the circuit is restrained, and thereafter the simulation for the combination of the layout pattern information 1 can be carried out. As a matter of course, any inconvenience may not be caused by executing batchwise the simulations in SS5 by previously setting all of the combinations of the component parameters. Getting back to SS3 from SS5, the step of performing the execution repeatedly a number of times equivalent to the number of the selected target groups, corresponds to a repeatedly executing the setting the fixed parameter values through the selecting a group as a next selection group. As a result of the simulation, the current-voltage characteristic, the power consumption, the delay time, etc of the circuit including the multiplicity of transistors are calculated.

Figure 11:
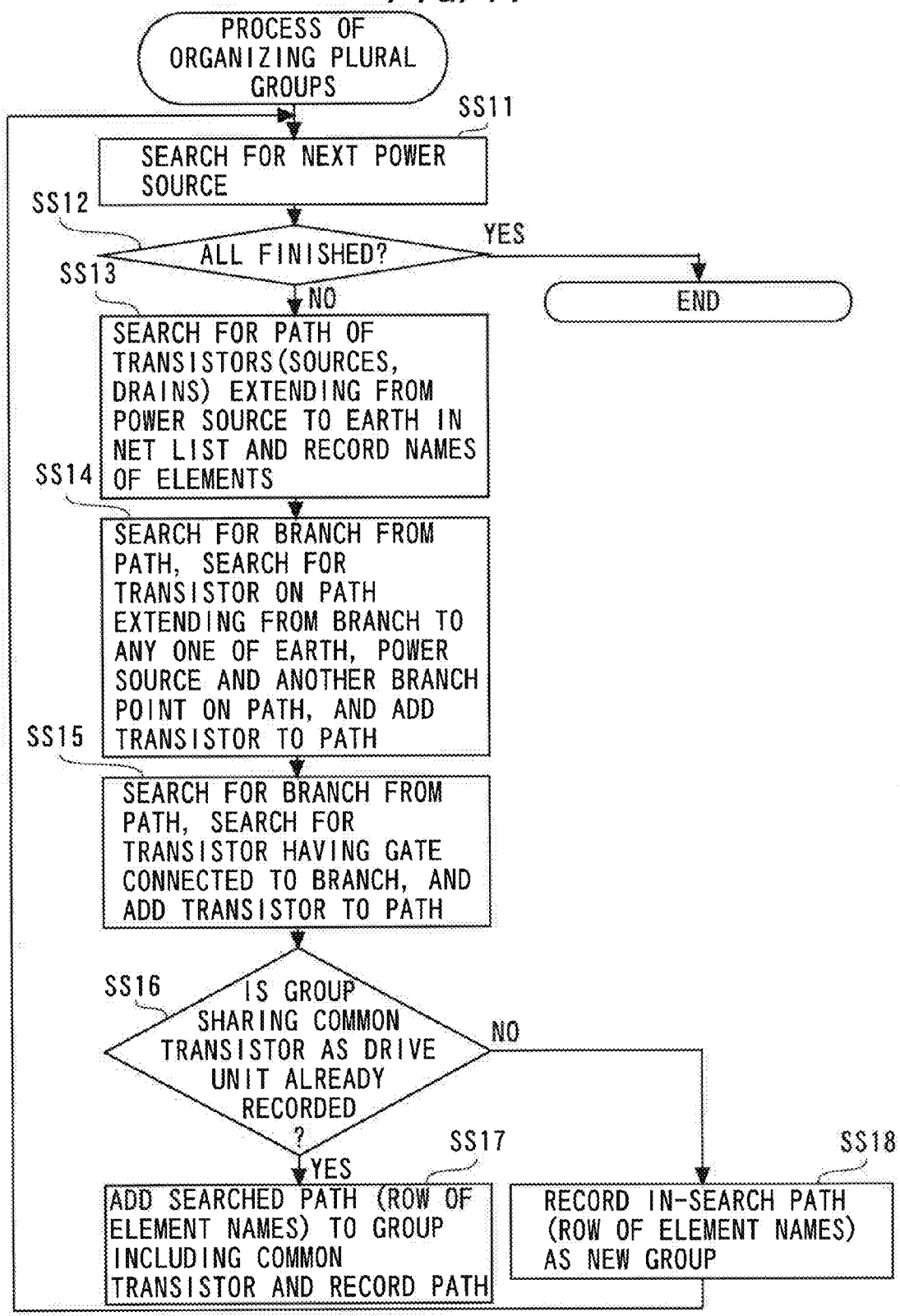
FIG. 11 is a diagram illustrating details of a procedure of organizing a plurality of groups each including a plurality of transistors.

FIG. 11 exemplifies the detailed procedure (SS1 in FIG. 10) of organizing the plurality of groups each including the plurality of transistors. In this process, the computer aided design equipment sequentially searches the net list for the power sources (SS11). Then, the computer aided design equipment determines whether all of the power sources in the net list are processed or not (SS12).

Then, if there is still a not-yet-processed power source, the computer aided design equipment, with respect to the not-yet-processed power source, searches the net list for a transistor path extending from this power source (which will hereinafter be termed the power source at a start point), and records a name of the element (SS13). Herein, the transistor path is a path connected at the source and the drain, through which the electric current flows when the transistor is kept in an ON-state. This path is referred to as a current path. Further, this transistor is also a transistor becoming a drive unit in the current path.

Next, the computer aided design equipment searches the net list for a current path branching off the (main) current path (SS14). Herein, the "current path branching off" connotes a transistor path extending from the branch point of the current path to any one of the earth, another power source other than the power source at the start point and another branch point on the present path. Moreover, the "current path branching off" includes a path temporarily branching off the branch point, passing through the drain(s) and the source(s) of the one or more transistors, and returning to a point other than the branch point on the original current path. This type of current path is also a path, connected at the source and the drain, through which the electric current flows when the transistor is kept in the ON-state.

Subsequently, the computer aided design equipment searches for a branch from the path, further searches for a transistor with a gate connected to this branch, and makes an addition to the path (SS15). The transistor with the gate connected is a transistor becoming a load on the current path.

Next, it is determined whether or not the current paths among the already-searched-and-recorded current paths sharing in common the transistor becoming the drive unit with the now-searching-target current paths (SS16). If the current paths sharing in common the transistor becoming the drive unit with the now-searching-target current paths have already been recorded, the now-searching-target current paths and the already-recorded paths are synthesized and categorized into a group of the transistors (SS17).

While on the other hand, if the current paths sharing in common the transistor becoming the drive unit with the now-searching-target current paths do not exist, the transistors included in the now-searching-target current paths are recorded as a newly searched group (SS18). Thereafter, the computer aided design equipment loops the control back to SS11. Then, upon finishing processing all of the power sources, the computer aided design equipment terminates the process of organizing the plurality of groups each including the plurality of transistors.

(Model Generator)

In a process by the model generator, the computer aided design equipment acquires, through the multiple linear regression analysis, the polynomial (the first mapping relation), wherein the variables are the component parameters, and the function values are the circuit characteristics such as the delay time, the standby power consumption, the total power consumption and the leak current of the circuit, which are obtained by simulation. This process is similar to the process by the simulation parameter modeling unit (the process of obtaining the polynomial of the mapping relation from the simulation parameters to the transistor characteristic values, or the process of obtaining the polynomial of the mapping relation from the transistor characteristic values to the simulation parameters).

In this case, however, the component parameters of the transistors, which are unique to each group, form a term of the polynomial, the term containing parameter-to-parameter interaction. On the other hand, the parameters of the transistors, which are not common to the plurality of groups, form a term of the polynomial, the term containing none of the interaction with other transistors.

A generated formula of the characteristic values is exemplified as below. Herein, an assumption is that transistors T1, T2 and T3 are included in one group. Another assumption is that transistors T4, T5 and T6 are included in another group.

Further, a gate length of the transistor T1 is expressed by a variable of LgT1, and a gate width thereof is expressed by a variable of WgT1. This representation is the same with other transistors T2-T6.

$$\text{Circuit characteristic} = F1(LgT1, LgT2, LgT3, WgT1, WgT2, WgT3) + F2(LgT4, LgT5, LgT6, WgT4, WgT5, WgT6) + \ldots$$
$$F1 = \Sigma a_{ijklmn}(LgT1)^i \times (LgT2)^j \times (LgT3)^k \times (WgT1)^l \times (WgT2)^m \times (WgT3)^n \quad \text{(Mathematical Expression 5)}$$

where i, j, k, l, m, n are integers ranging from 0 up to the maximum degree, and aijk is a coefficient determined by the multiple linear regression analysis. Accordingly, a sum (F1) of the terms shown by the circuit characteristics in the Mathematical Expression 5 contains the terms of a product of the variables of the component parameters corresponding to the gate lengths and the gate widths of the group of the transistors T1, T2 and T3. Similarly, a sum (F2) of the terms contains the terms of a product of the variables of the component parameters corresponding to the gate lengths and the gate widths of the group of the transistors T4, T5 and T6.

Note that the Mathematical Expression 5 exemplifies the terms including the product of the six variables but does not imply that the types of the variables (the number of the variables) included in the terms are limited to "6". Further, in the Mathematical Expression 5, for example, when k=l=m=n=0, as a matter of course, it follows that the terms containing the two variables of LgT1 and LgT2 are expressed.

On the other hand, the circuit characteristic given in the Mathematical Expression 5 does not contain the product of the variables corresponding to the component parameters of the two or more transistors, e.g., the transistors T1 and T4 belonging to the different group including none of the common transistor.

The following is a reason thereof. Namely, the computer aided design equipment executes the simulation in a way that changes the component parameters without taking account of all of the combinations of the component parameters of the transistors, and taking account of the combinations of the transistors of the portion (the partial circuit) that determines the local signal delay. Accordingly, the obtained simulation result (the circuit characteristics) becomes, with respect to the transistor aggregation organizing one group, what is based on the plural combinations of the component parameters of each transistor aggregation. As a result, in regard to the combinations of the component parameters of the transistor aggregation of a specified group, the component parameters of the transistor aggregations of other groups take fixed values. Accordingly, the component parameters are combined in one way among the plurality of groups other than the partial circuit, and the circuit characteristics defined as the result of the simulation are limited to one set of values.

For example, in the case described above, with respect to the transistors T1 and T4, the simulation is conducted for only the combinations with only the changed component parameters of one of these transistors. Hence, the number of samples obtained as the result of the simulation for the combinations of the component parameters among the plurality of groups is by far smaller than by changing the component parameters of the transistor aggregation of the same group. Accordingly, in the terms of the product of the variables of the component parameters among the plurality of groups, there are a less number of errors by setting a coefficient to "0" from the beginning.

Moreover, physically, the transistors belonging to different groups are not included in the partial circuit including the drive unit and the load and therefore do not, it is considered, interfere with each other. Consequently, when the multiple linear regression analysis is executed with the component parameters and the acquired circuit characteristics, the value of the coefficient in the terms of the product of the variables equivalent to the combinations of the component parameters applied extensively to between the groups becomes approximately "0". Accordingly, in the polynomial obtained by the multiple linear regression analysis, as in the case of the Mathematical Expression 5, only the coefficient of the product of the component parameters of the plurality of transistors belonging to the same group and undergoing the execution of the simulation for the multiplicity of combinations, is presumed to take a significant value. The more precise value can be efficiently obtained by setting the coefficient to "0" with respect to the terms of the product of the variables corresponding to the combinations of the component parameters applied extensively to between the plural groups than by obtaining the coefficients of all of the terms in an all-encompassing manner.

(Table Generator)

The table generator of the computer aided design equipment sets the combinations of the component parameters, and acquires the values (the characteristic values) in the polynomial. Then, the combinations of the obtained variable values and characteristic values are tabularized. The table is organized by the 2-tuple of each of the component parameters of the respective transistors and each of the circuit characteristics acquired from the component parameters.

Then, the computer aided design equipment performs screening (selecting) a part (records) of the table based on predetermined restriction items. To be specific, only records, which satisfy the restriction items, in the table are selected, and the values of the variables contained in these records are retained. Herein, the "predetermined restriction items" are, for instance, restriction items about the component parameters that should be restricted in terms of the design rule. The restriction items are exemplified by the layout pattern information 1 illustrated in FIG. 4 or the restriction values of the design characteristic information illustrated in FIG. 1, and so on.

(Optimal Circuit Extracting Unit)

The optimal circuit extracting unit of the computer aided design equipment determines whether the obtained circuit characteristics satisfy the design target values or not. Then, if the circuit characteristics attain the design target values, the component parameters corresponding to the circuit characteristics are presented to the user. The user receives the presentation of the component parameters attaining the design target values and the layout or the physical characteristics in design, and can proceed with the design.

Further, the optimal circuit extracting unit generates the layout patterns of the semiconductor circuit that reflect the gate length, the gate width, the threshold voltage, the mobility, etc acquired from the result of such a design, then generates a photo mask, and determines manufacturing parameters in the manufacturing processes of the semiconductor circuit. Then, the semiconductor circuit is manufactured based on the manufacturing parameters through the manufacturing processes such as exposure, development, etching, implantation of an impurity, a thermal treatment, formation of an oxide film, formation of a metal film, planarization and formation of a protective film.

<Manufacturing Process of Semiconductor Device>

Figure 22:
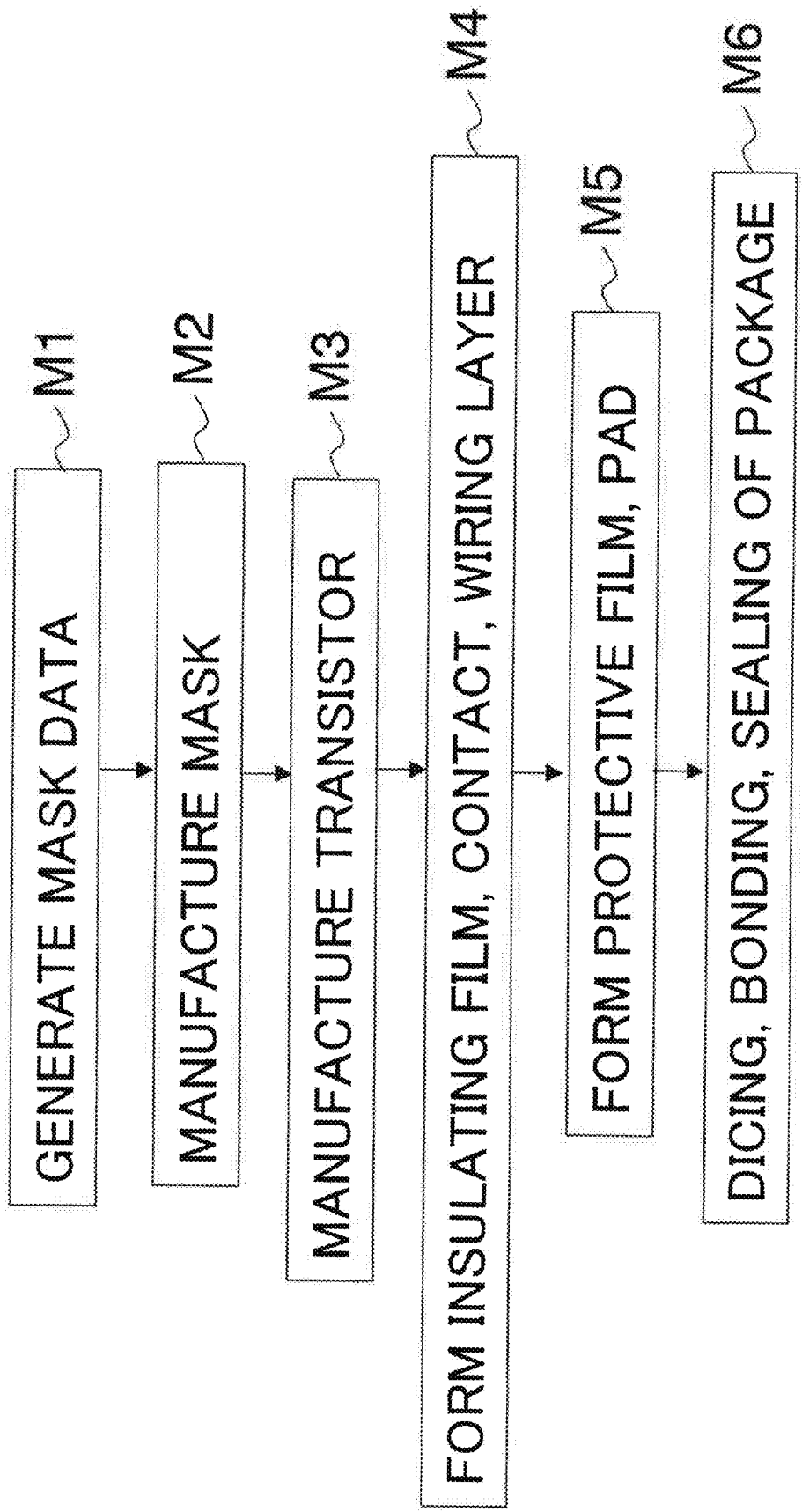
FIG. 22 is a diagram illustrating a semiconductor device manufacturing process.

FIG. 22 illustrates the manufacturing process (details of S106 in FIG. 1) of generating the design data for the semiconductor device on the basis of the layout patterns and the net list by the computer aided design equipment according to the embodiment, and manufacturing the semiconductor device. The processes by the computer aided design equipment are effective in, e.g., the design of macro data or cell data incorporated into the semiconductor device. Namely, according to the computer aided design equipment, under such a condition that the macro data or the cell data attain the performance of the design target, the gate length, the gate width, etc of the transistor in the macro data or the cell data are optimized.

Next, the data of the whole semiconductor device are designed based on the thus-optimized macro data or cell data. Then, mask data is generated from the data on every layer of the design data for the semiconductor device (M1). The mask data represents data taking an input data format of mask manufacturing equipment. The mask data is generated in a process of the computer that executes a computer program for generating the mask data.

Next, the mask manufacturing equipment forms a pattern by use of a shielding material such as chromium on a transparent glass substrate in a way that utilizes electron beams, a laser, etc (M2). To be specific, a resist is applied over the glass substrate coated with the shielding material, and the pattern corresponding to the design data is exposed to the beam such as the electron beams and the laser beams. Then, a transfer pattern on the glass substrate is generated through the developing process and the etching process. Accordingly, the pattern is formed on the mask of each layer with dimensions determined based on the design in the embodiment. For example, the mask pattern of the gate layer is formed based on the gate length, the gate width, etc, which are determined in the processes by the computer aided design equipment.

Then, the mask pattern is transferred onto the semiconductor substrate, thereby forming the pattern of the semiconductor element, e.g., the transistor according to the design data (M3). The transistor is formed by repeating the resist applying process onto the semiconductor substrate, the transferring process (which is also termed a photolithographic process) of the mask pattern onto the photo resist by transferring equipment (a stepper etc), a photo resist developing process, an impurity doping process, formation of an insulating film (formation of a nitride film and the oxide film), the etching process, formation of a polycrystalline silicon film, and so on.

The impurity doping process normally includes applying the ion implantation using ion implantation equipment. Vapor phase diffusion and solid phase diffusion based on the thermal treatment may, however, be applied.

A silicon nitride ($Si_3N_4$) film is formed as the nitride film. The formation of the nitride film can include utilizing, e.g., a direct thermal nitridation method, a deposition method using a CVD (Chemical Vapor Deposition) technique, and so forth. RTN (Rapid Thermal Nitridation) can be applied as the direct thermal nitridation method. Formed as the oxide film are a silicon oxide ($SiO_2$) film, a tantalum pentoxide ($Ta_2O_5$) film, an aluminum oxide ($Al_2O_3$) film, a strontium titanate film, etc. The formation of the oxide film can include applying a thermal oxidation method, an anodizing process, a plasma oxidation method, the deposition method utilizing the CVD technique, a heteroepitaxial growth method, a sticking method and an SIMOX (Separation by Implanted Oxygen) method based on the ion implantation.

Moreover, the etching process includes using dry etching equipment or wet etching equipment, and the material on the surface of the semiconductor substrate is thereby removed. For example, the formation of the gate electrode is that a region covered with the resist is left, while the polycrystalline silicon of a region covered with none of the resist is removed.

Herein, a gate pattern is formed on the semiconductor substrate by transferring the mask pattern in a way that sets the gate length, the gate width, etc determined as the target values by the computer aided design equipment. In this case, the photo resist is coated over the polycrystalline silicon film formed on the gate oxide film, and the gate pattern is formed on the semiconductor substrate through the processes of projection of gate patterns, developing and etching the gate pattern on the mask. Further, the oxide film is formed and etched, thus forming a sidewall of the gate pattern. Still further, the photolithography and the implantation of the impurity are carried out, i.e., an impurity is implanted into the P-type transistor, and an impurity is implanted into the N-type transistor, thereby forming the source and the drain. A characteristic of the semiconductor device is that the transistor included in the semiconductor device is greatly influenced by particularly the gate length and the gate width. For example, the target performance is satisfied in the way of setting the proper gate length and gate width by the manufacturing method according to the embodiment, and it therefore follows that the semiconductor device can be manufactured with the gate length and the gate width, which are acceptable in terms of the semiconductor device manufacturing process. As a result, for instance, an allowance in the process condition is produced, and it is feasible to expect an effect in improving a yield. It should be noted that according to the manufacturing method in the embodiment, without being limited to the gate length and the gate width, as a matter of course, the proper values can be set for the variety of layout parameters exemplified in FIG. 4.

Thereafter, an insulating film, a contact hole (a plug layer) and one or more wiring layers are formed on the upper layer of the transistor (M4). In this process also, the processes of forming the insulating film, forming the metal film, transferring the mask pattern and etching are repeated.

Moreover, the protective film and a pad are formed (M5). Then, the semiconductor device is manufactured through a dicing process, a bonding process and a package sealing process (M6).

As discussed above, the mask is formed based on the design data set to the proper dimensions via the design process (S101-S105 in FIG. 5) by the computer aided design equipment according to the embodiment. Then, the transistor attaining the target performance under the adequate conditions is formed by transferring the pattern on the mask with projection light onto the semiconductor substrate, thus manufacturing the semiconductor device.

Working Examples

Figure 12:
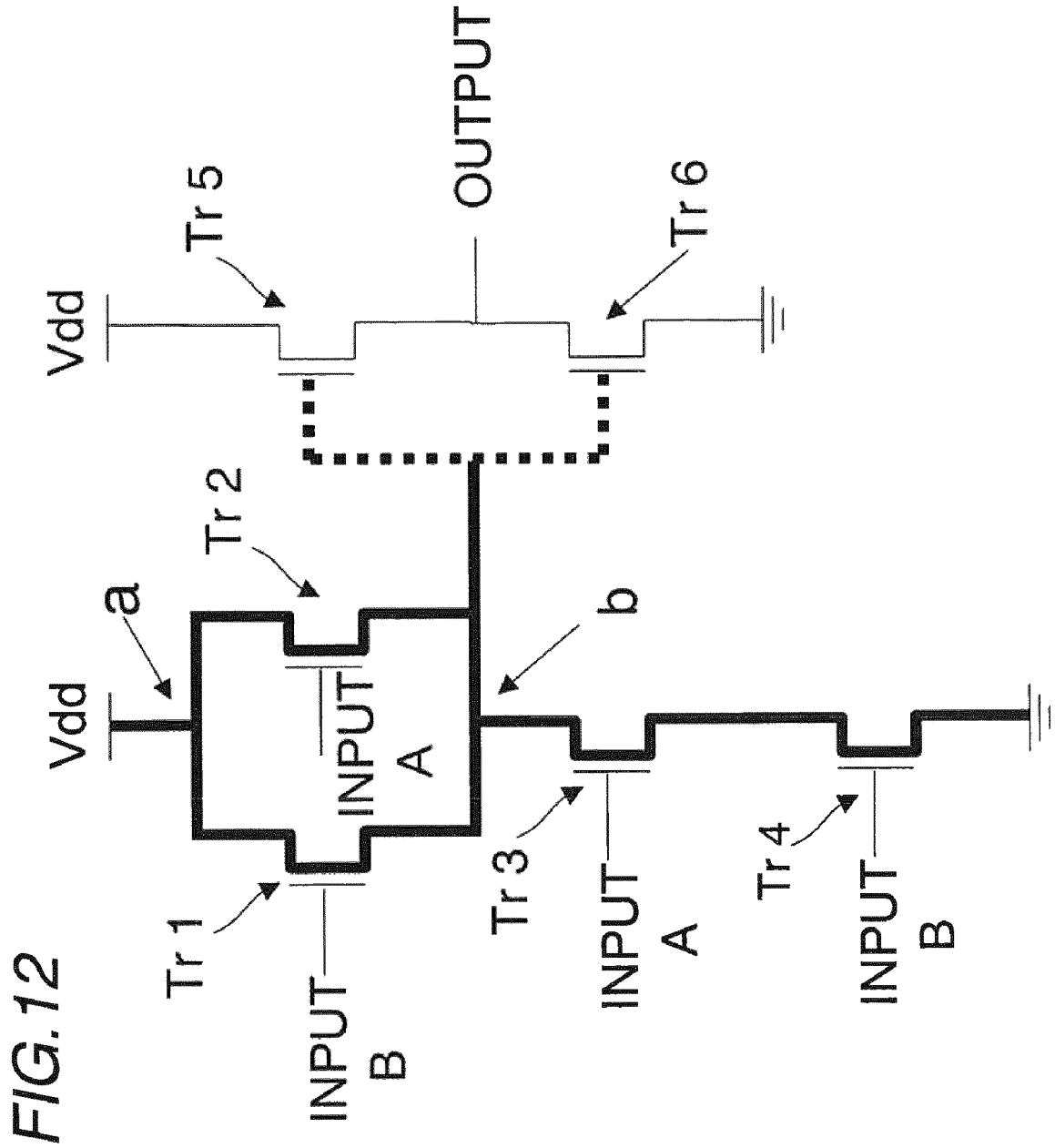
FIG. 12 is a diagram illustrating a process of organizing the plurality of groups each including the plurality of transistors selected from all of the transistors in the circuit.

FIG. 12 is a diagram exemplifying a process of organizing a plurality of groups each including the plurality of transistors selected from all of the transistors in the circuit. The process is herein explained by exemplifying a 2-input AND circuit. Search target transistors are a P-channel transistor and an N-channel transistor of which sources or drains are connected to the power source, and further transistors of which the sources or the drains are connected to these P- and N-channel transistors. In FIG. 12, a solid line depicts, when the thus-searched transistors are set in the ON-state, current paths connected in series to the earth line from the power source line and also path lines branching off the current paths. Herein, the branched path represents the current path to which both terminals (the source and the drain) of the transistor are connected, and also connotes the current path connected in a parallel relation with the path to be branched off.

The computer aided design equipment organizes transistors Tr1, Tr2, Tr3, Tr4 forming these current paths into the same group. To be specific, in FIG. 12, when the transistors Tr1, Tr3, Tr4 are sequentially switched ON, the current path extending from the power source to the ground is formed, and the transistors Tr forming this current path is grouped. The transistor Tr2, in which both of the terminals (a-point and b-point) of the transistor are connected to the current path (connected in parallel with Tr1), is added to the group. Further, transistors Tr5, Tr6, of which the gates are connected to this current path, are added to the same group.

In FIG. 12, the connection extending from the current path to the gate is depicted by a dotted line. Thus, the transistors building up the partial circuit that determines the local signal delay can be grouped en bloc.

Figure 13A:
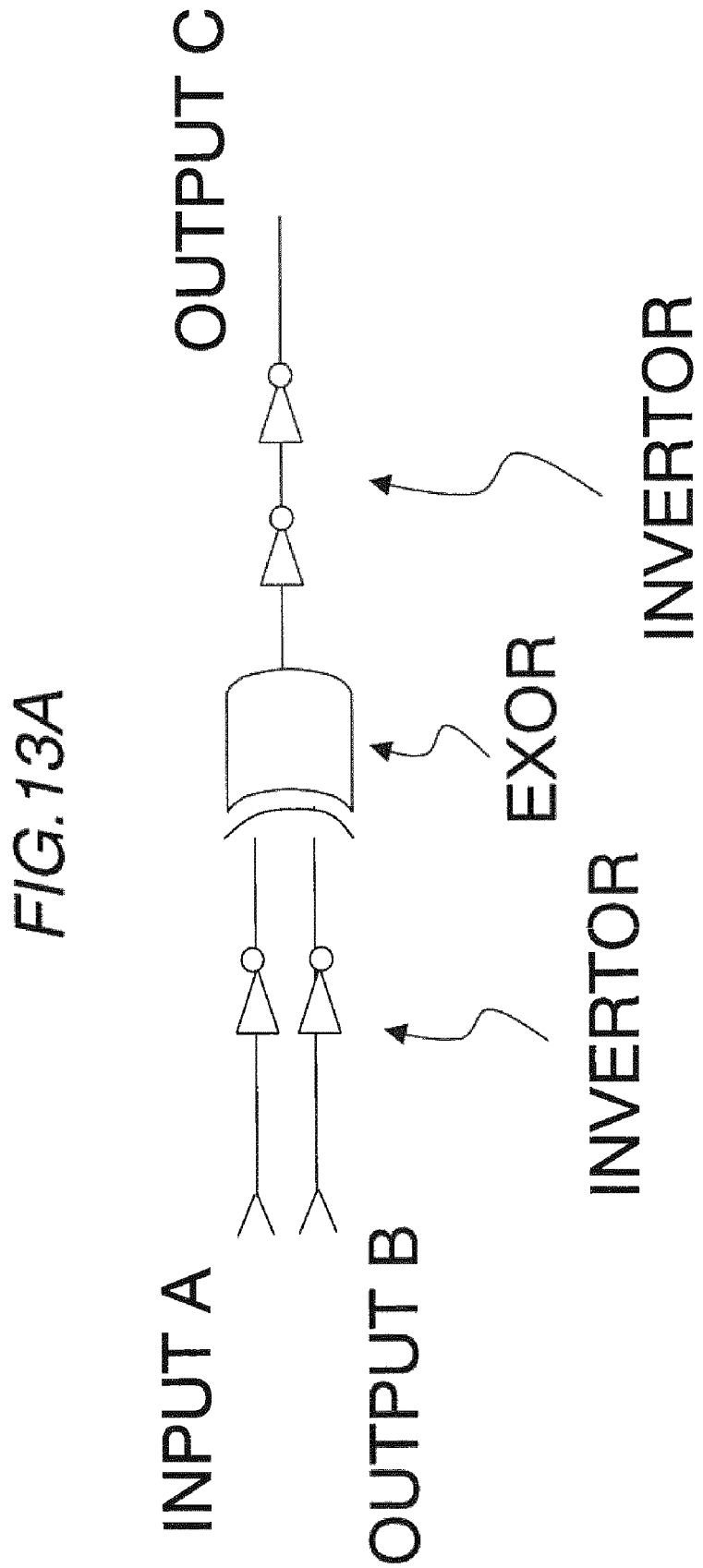
FIG. 13A is a diagram illustrating an example of a circuit including a combination of an inverter and EXOR (EXclusive OR)
Figure 13B:
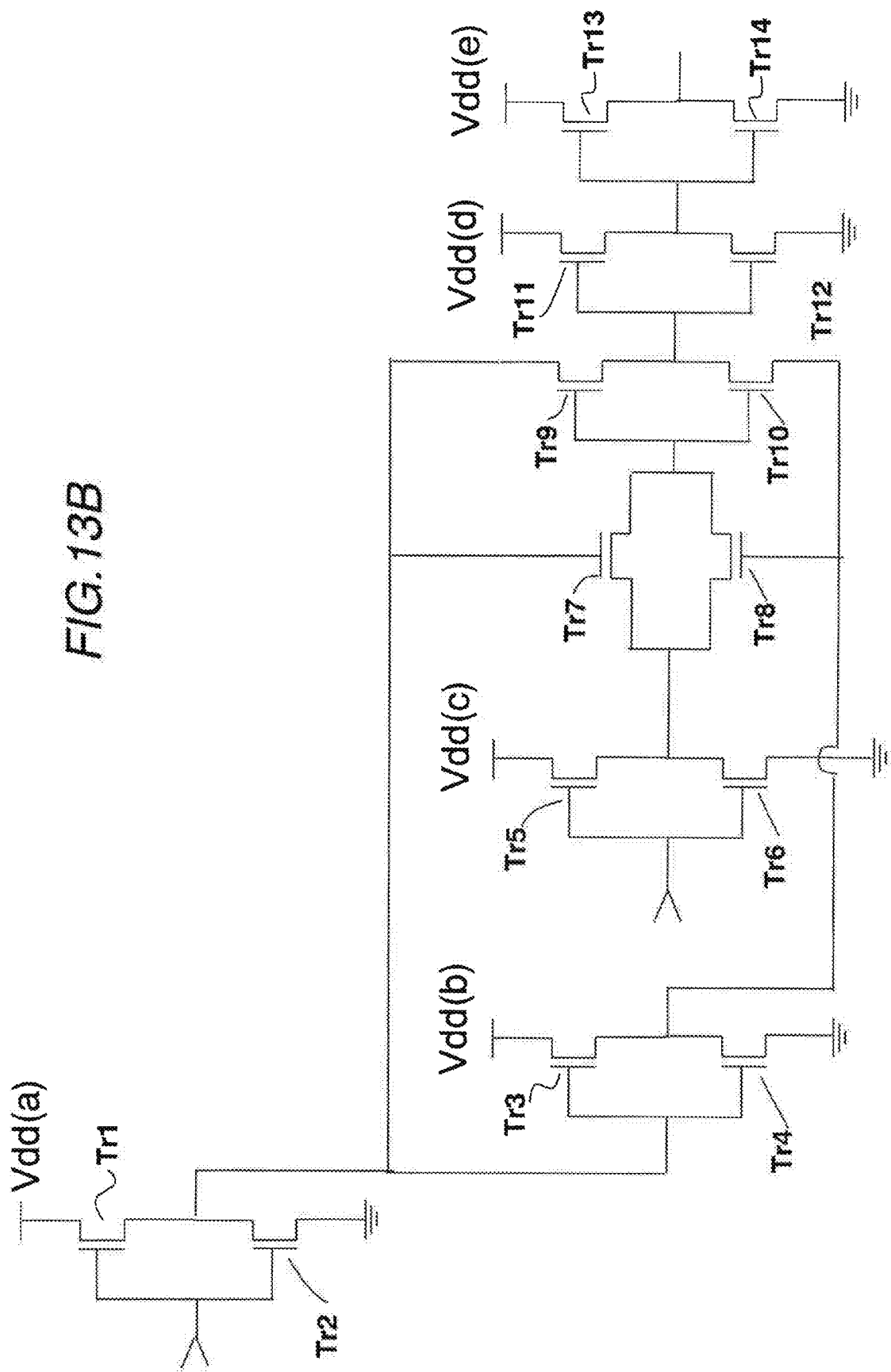
FIG. 13B is a diagram illustrating an example of a circuit configuration in which the circuit in FIG. 13A is realized by the combinations of the transistors.
Figure 14:
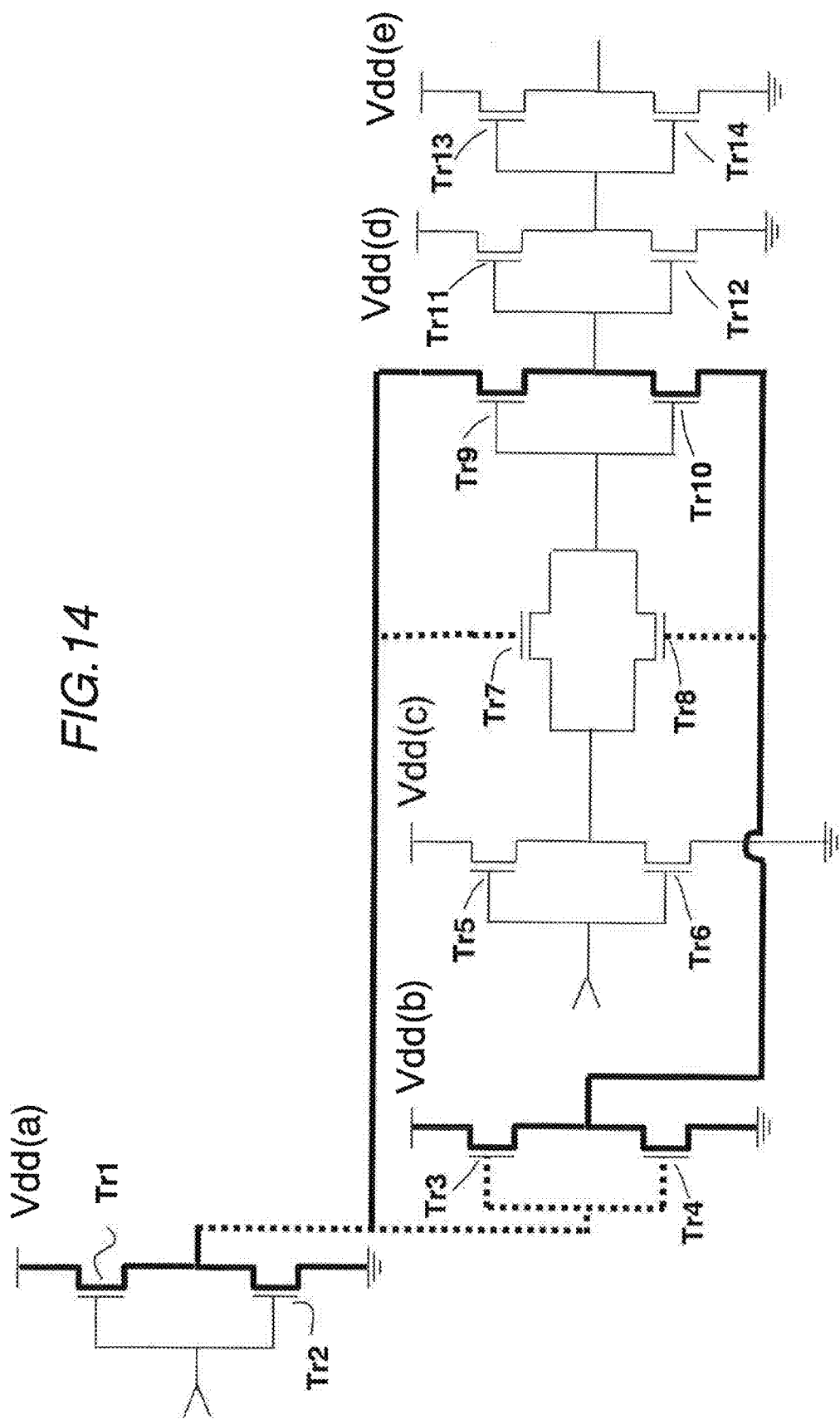
FIG. 14 is a diagram of a processing example of a group organizing process.

FIG. 13A illustrates an example of a circuit including a combination of an inverter and EXOR (EXclusive OR). FIG. 13B illustrates an example of a circuit configuration in which the circuit in FIG. 13A is realized by combining the transistors. A processing example of the grouping process will be described with reference to FIGS. 14 through 16. The transistors Tr1, Tr2, Tr9, Tr10, Tr4 are connected to the current path connecting to a power source Vdd(a). The transistors Tr3, Tr4, Tr10, Tr9, Tr2 are connected to the current path connecting to a power source Vdd(b). The transistors Tr4, Tr9, Tr10 are common, and hence one current path (depicted by a bold solid line in FIG. 14) can be defined with respect to the two transistor aggregations connected respectively to the two power sources Vdd(a) and Vdd(b). Then, the transistors Tr1 Tr2 Tr9 Tr10, Tr3 Tr4 forming this path are organized into one group en bloc. Further, the transistors Tr7, Tr8, of which the gates are connected to this current path (depicted by bold dotted lines in FIG. 14) are added to the same group. Thus, the eight pieces of transistors Tr1, Tr2, Tr9, Tr10, Tr3, Tr4, Tr7, Tr8 are organized into a group (a)/(b).

Figure 15:
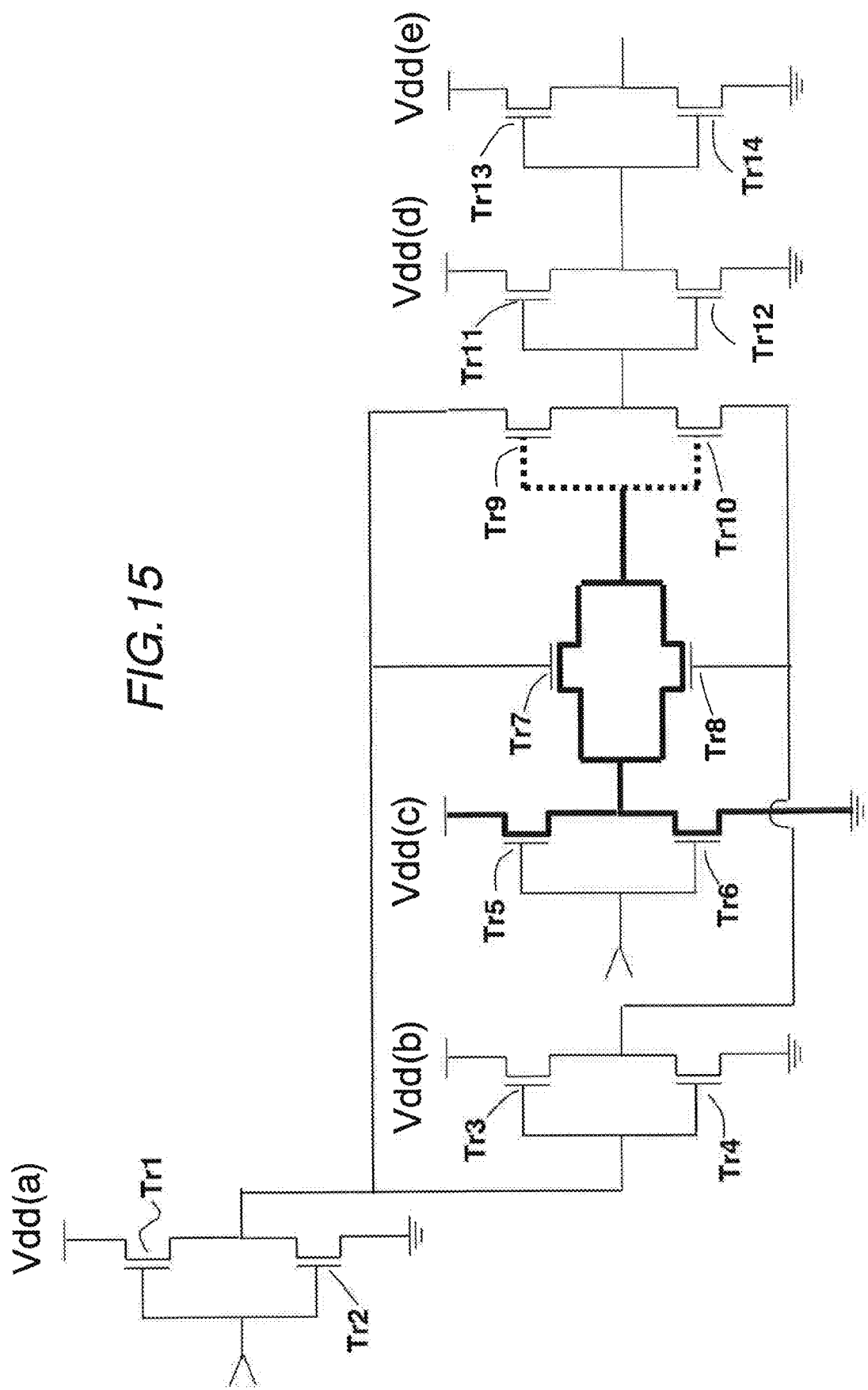
FIG. 15 is a diagram of a processing example of the group organizing process.

Similarly, the six pieces of transistors Tr5, Tr6, Tr7, Tr8, Tr9, Tr10 are aggregated into a group (c) connected to the power source Vdd(c) (FIG. 15).

Figure 16:
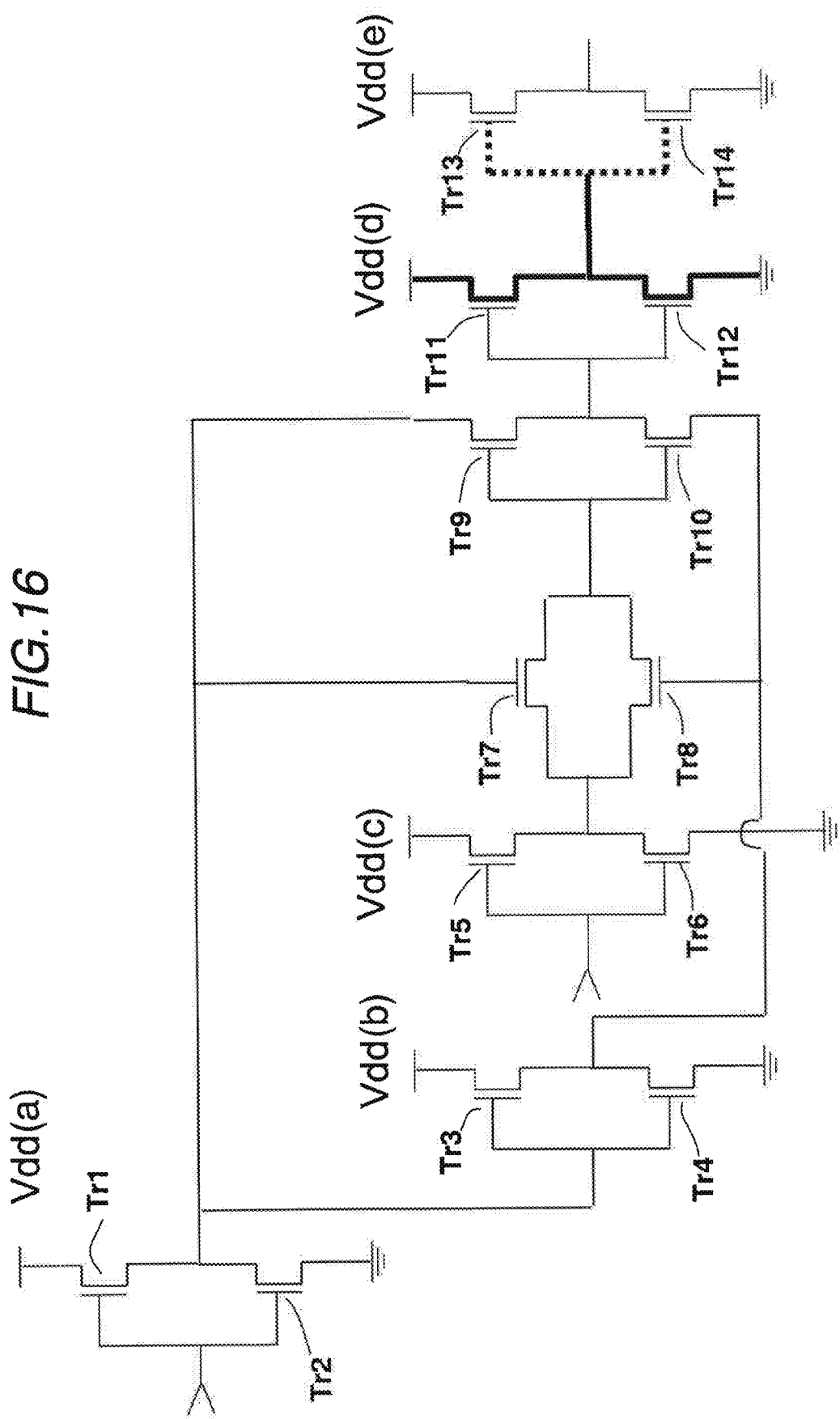
FIG. 16 is a diagram of a processing example of the group organizing process.

Likewise, the four pieces of transistors Tr11, Tr12, Tr13, Tr14 are aggregated into a group (d) connected to the power source Vdd(d) (FIG. 16). Moreover, the two pieces of transistors Tr13, Tr14 are similarly aggregated into a group (e) connected to the power source Vdd(e) (FIG. 16). Through the process given above, the transistors of the circuit in 13B grouped into the power source groups as follows.

a. Vdd(a)(b): Tr1, Tr2, Tr9, Tr10, Tr3, Tr4
b. Vdd(c): Tr5, Tr6, Tr7, Tr8, Tr9, Tr10
c. Vdd(d): Tr11, Tr12, Tr13, Tr14
d. Vdd(e): Tr13, Tr14

The transistors Tr9, Tr10 are included in the group Vdd(a)(b) and the group Vdd(c) in common. Even in a case where the transistor included as the drive unit and the transistor included as the load are common, the groups concerned are not aggregated.

Figure 17B:
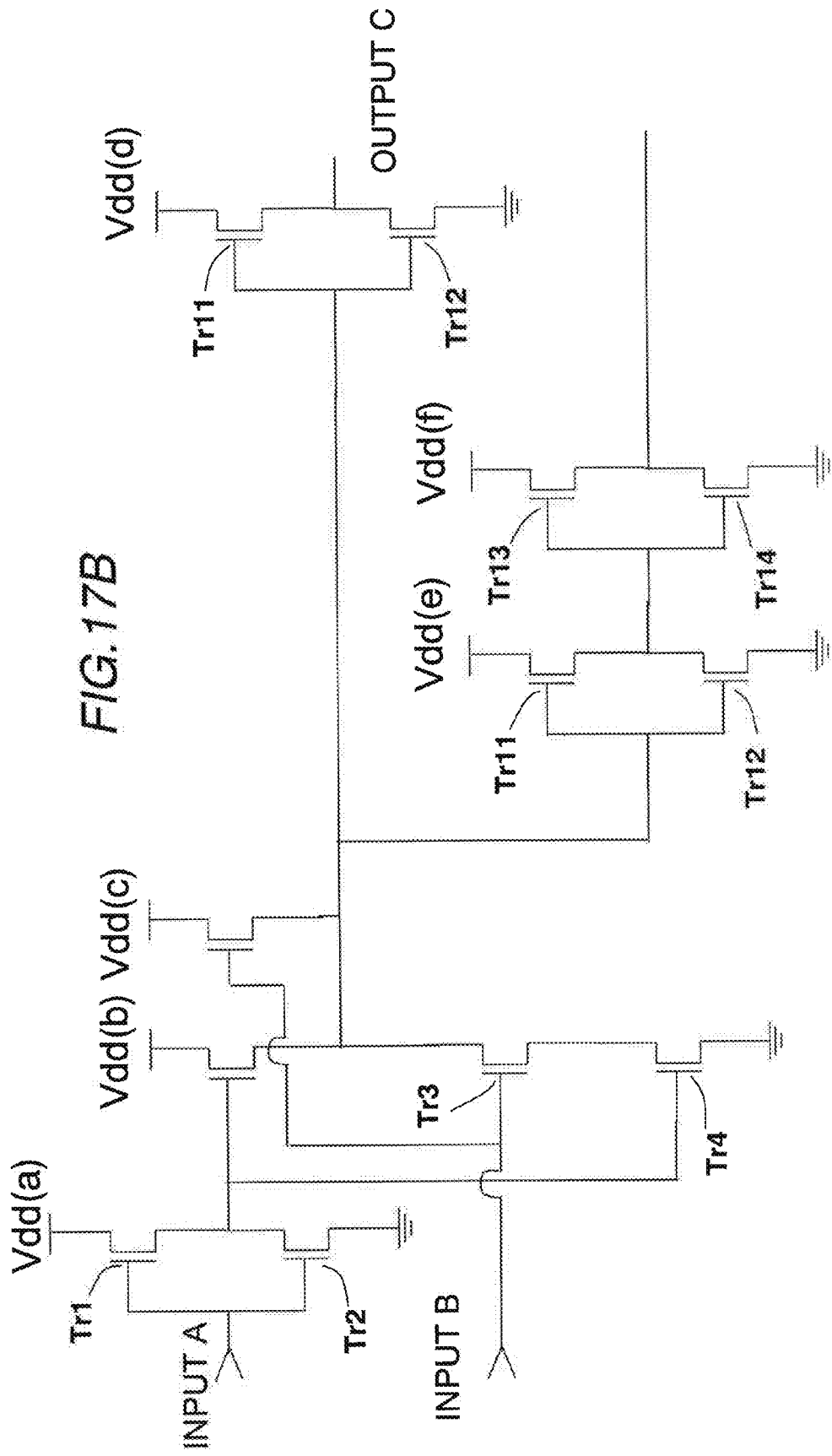
FIG. 17B is a diagram illustrating an example of a circuit configuration in which the circuit in FIG. 17A is realized by the combinations of the transistors.

FIGS. 17A and 17B illustrate examples of different circuits each including a combination of the inverter and NAND. FIG. 18 illustrates a result of how the transistors of the circuit in FIG. 17B are grouped. The following are the groups in this case. In FIG. 18, symbols (a circle, a triangle, a square, etc.) representing the groups are marked in the vicinity of the transistors.

Vdd(a): Tr1, Tr2, Tr5, Tr4
Vdd(b/c): Tr5, Tr3, Tr4, Tr6, Tr7, Tr8, Tr9, Tr10
Vdd(d): Tr7, Tr8
Vdd(e): Tr9, Tr10, Tr11, Tr12
Vdd(f): Tr11, Tr12

In this example, the transistors Tr4 and Tr5 are included in both of the group of the power source Vdd(a) and the group of the power source Vdd(b/c). Further, the transistors Tr7 and Tr8 are included in the group of the power source Vdd(b/c) and the group of the power source Vdd(d). Still further, the transistors Tr9 and Tr10 are included in the group of the power source Vdd(b/c) and the group of the power source Vdd(e). Yet further, the transistors Tr11 and Tr12 are included in both of the group of the power source Vdd(e) and the group of the power source Vdd(f). In this example, there exist the transistors Tr common to the plurality of groups. It is noted, as for the transistors included in the plurality of groups, the transistors of one group are included as the circuit-drive transistors of which the sources and the drains are connected to the current path. Further, the other group includes the transistors of which the gates serve as the circuit loads included in the current path.

<Effects>

Given next is a description of effects yielded by the computer aided design equipment that sets the combinations of the layout patterns per group. For example, the component parameters are two parameters of the gate length and the gate width, which are each set at "3" levels. Specifically, parameters Lg1a, Lg1b, Lg1c are set for the gate length of the transistor Tr1, while parameters W1a, W1b, W1c are set for the gate width thereof.

Similarly, with respect to the transistor Tr2, parameters Lg2a, Lg2b, Lg2c are set for the gate length, while W2a, W2b, W2c are set for the gate width, and so on. When the combinations of the parameters for every transistor are set in a round-robin manner, there are 9-way combinations such as Lg1a/W1a, Lg1a/W1b, Lg1a/W1c, Lg1b/W1a, Lg1b/W1b, Lg1b/W1c, Lg1c/W1a, Lg1c/W1b, Lg1c/W1c. The group (b/c) in FIG. 18 includes the eight transistors Tr, and hence there are $9^8$-way combinations of the parameters within the group.

The combination count per transistor Tr can be rationally reduced by use of a design of experiments or an orthogonal allocation table. For instance, the combination count can be also reduced to the 5-way combinations such as Lg1a/W1a, Lg1a/W1c, Lg1b/W1b, Lg1c/W1a, Lg1c/W1c. A concept of the combinations of the parameters when the gate length and the gate width of the single transistor are combined at the 3 levels and a concept of the rational combination using the design of experiments or the orthogonal allocation table, are exemplified in the group 1 of FIG. 19. Specifically, in the case of showing the values of the gate length and the gate width at the 3 levels "high", "middle" and "low", the 5-way combinations (the gate length, the gate width)=("high", "high") ("middle", "middle") ("low", "low") ("low", "high") are selected from the 9-way combinations.

In the case of the group (b) in FIG. 18, the combination count of the parameters within the group comes to $5^8$ (5 to the power of 8, namely, the base 5 and the exponent 8) ways. Similarly, the combination count in the group (a) in FIG. 18 is given $5^4$ (5 to the power of 4) ways, and the combination count in the group (e) is given $5^4$ (5 to the power of 4) ways. As a matter of course, any inconvenience may not be caused by incorporating a different parameter representing the transistor characteristic such as a threshold value (Vth) other than the component parameters such as the gate length and the gate width into the combinations of the parameters per transistor. If the parameter count rises, the efficient combinations can be organized by use of the design of experiments or the orthogonal allocation table. For example, in the case of organizing the combinations of the 3 parameters such as the gate length, the gate width and the transistor threshold value (Vth) at the 3 levels, 13-way combinations are sufficient against 27-way combinations being given as the round-robin combination count. In this case, it follows that the same combinations as those in FIG. 19 are obtained for the three-dimensional parameters of the gate length, the gate width and the transistor threshold value (Vth).

For example, the combinations at the 3 levels such as "high", "middle" and "low" are presumed, wherein the gate length, the gate width and the transistor threshold value are set as variables in X-, Y- and Z-axis directions. In this case, when all of the combinations are taken into consideration, there is obtained a combination count equivalent to 27 lattice-points in the three-dimensional space. Herein, in place of selecting all of the 27 lattice-points, four points of ("middle", "high") ("middle", "low") ("high", "middle") ("low", "middle") with respect to (X, Y) are selected when Z="low" and Z="high". Further, when Z="middle", five points such as ("high", "high") ("high", "low") ("low", "high") ("low", "low") ("middle", "middle") are selected. The combination count can be reduced to 13 ways in the procedure of the design of experiments described above.

FIG. 19 illustrates a procedure of setting the parameters for the whole circuit. In the case of making a round-robin trial about all of the parameter combinations for the transistors within the circuit, there exist the combinations equivalent to a power of the number of the transistors building up the circuit with respect to the number of the parameter combinations for one single transistor.

The optimization of the circuit layout by the computer aided design equipment does not entail considering all of the parameter combinations of the transistors configuring the circuit, but it may be sufficient to consider the portion (the partial circuit) that determines the local signal delay. Namely, it may be enough to consider the influence of the dependency on the layout combinations of only the transistor aggregation organizing one single group in the plurality of groups. Accordingly, the dependency on the layout combinations applied extensively to between the groups may not be taken into consideration. As a result, in the process of setting the layout parameters for the whole circuit, on the occasion of setting the combinations of the component parameters in the selected group, the parameters of the transistors of the non-selected groups may be set to some specified values.

For instance, as illustrated in FIG. 19, the 5-way values are set for the target group (the group 1 in FIG. 19). On the other hand, in the non-selected groups (the groups 2 and 3 in FIG. 19), it is general that the parameters are set to central values. If done in this way, the circuit example illustrated in FIG. 13B illustrates that the transistors are separated into the four groups (a/b), (c), (d) and (e), wherein the six transistors, the four transistors, the two transistors and the two transistors are included in these four groups, respectively. It is therefore understandable to simulate 16300-way combinations ($5^6$(5 to the 6)+$5^4$(5 to the 4)+$5^2$(5 to the 2)+$5^2$(5 to 2)=16300)(with the numerical values changed). In the case of organizing the layout combinations of all of the transistors within the circuit without executing the processes by the computer aided design equipment, there are given $5^{14}$(5 to the 14)=6103515625 ways, from which the effects of the invention are recognized to be extremely great.

Generally, it is assumed that the transistors of a certain circuit are separated into n-pieces of groups, and mi-pieces of transistors are given as the transistor count within the group. Supposing that there are 5-way combinations of the component parameters per transistor, it is understood from the following formula that the combination count of the component parameters necessary for optimizing the circuit is calculated as a total sum of the combination count ($5^{mi}$(5 to the power of mi)) of each group but does not increase explosively.

$$\sum_{i=1}^{n} 5^{mi}$$

Thus, it is readily presumed that the effects become extremely great as the circuit scale increases.

According to the computer aided design equipment, the plurality of characteristics of the semiconductor integrated circuit are modeled with the component parameters on the basis of the plurality of simulation results given from the plural combinations of the component parameters corresponding to the layout combinations. Furthermore, the plural combinations of the component parameters and the circuit characteristics are tabularized, and the optimal combinations are selected from the plural combinations of the component parameters. Finally, the layout of the transistor corresponding to the combinations of the component parameters is selected, and the optimization of the layout of the semiconductor integrated circuit is supported.

It is preferable that the following restrictions be provided in this modeling process. Namely, when the plurality of characteristics of the semiconductor integrated circuit is modeled with the polynomial of the component parameters on the basis of the plurality of simulation results, the parameters of the transistors within each group are expressed in the polynomial containing the interaction (the product of the variables), while the parameters of the transistors in the plural groups including none of the common transistors are expressed in the polynomial that does not contain the interaction thereof.

The following is a reason why so. Namely, the optimization of the circuit layout by the computer aided design equipment does not include considering all of the layout combinations of the transistors building up the circuit but includes considering only the portion that determines the local signal delay. Namely, what is considered is the influence of the dependency on the layout combinations about the transistor aggregation organizing one single group in the plurality of groups, and hence the simulations based on the combinations of the component parameters applied extensively to between the plurality of groups, are not performed. Therefore, even when the term containing the product of the mutual component parameters applied extensively to between the plurality of groups is provided in the polynomial representing the circuit characteristics in the modeling process, any significant sample count is not acquired. This is because, physically, there is the small influence on the circuit characteristics, which is caused by changing the parameter values in the combinations of the parameter values between the groups, and it can be estimated from the multiple linear regression analysis that the value of the coefficient becomes a value substantially approximate to "0".

Modified Example

In the embodiment discussed above, the component parameters of the transistors are extracted from the layout pattern information 1 and the net list 2, and the circuit simulation is executed. The pieces of layout pattern information 1 in this case are the values in design, which do not reflect the characteristics in the actual processes. The dimensions of the patterns formed by the actual semiconductor process are different from the dimensions in design as the case may be.

A deviation of the actual value from the standard value is caused by fluctuations in dimensions due to, e.g., the characteristics of the semiconductor manufacturing process. The characteristics of the semiconductor manufacturing process connote the characteristics appearing when conducting the exposure, the development, the etching, the growth of the film, the diffusion, the oxidation, etc. These fluctuations are, it is considered, derived from such a point that, e.g., an optical proximity effect, a selection ratio, a degree of anisotropy, the development, an advancement of the etching, etc fluctuate depending on the pattern density or the pattern dimensions.

Figure 20:
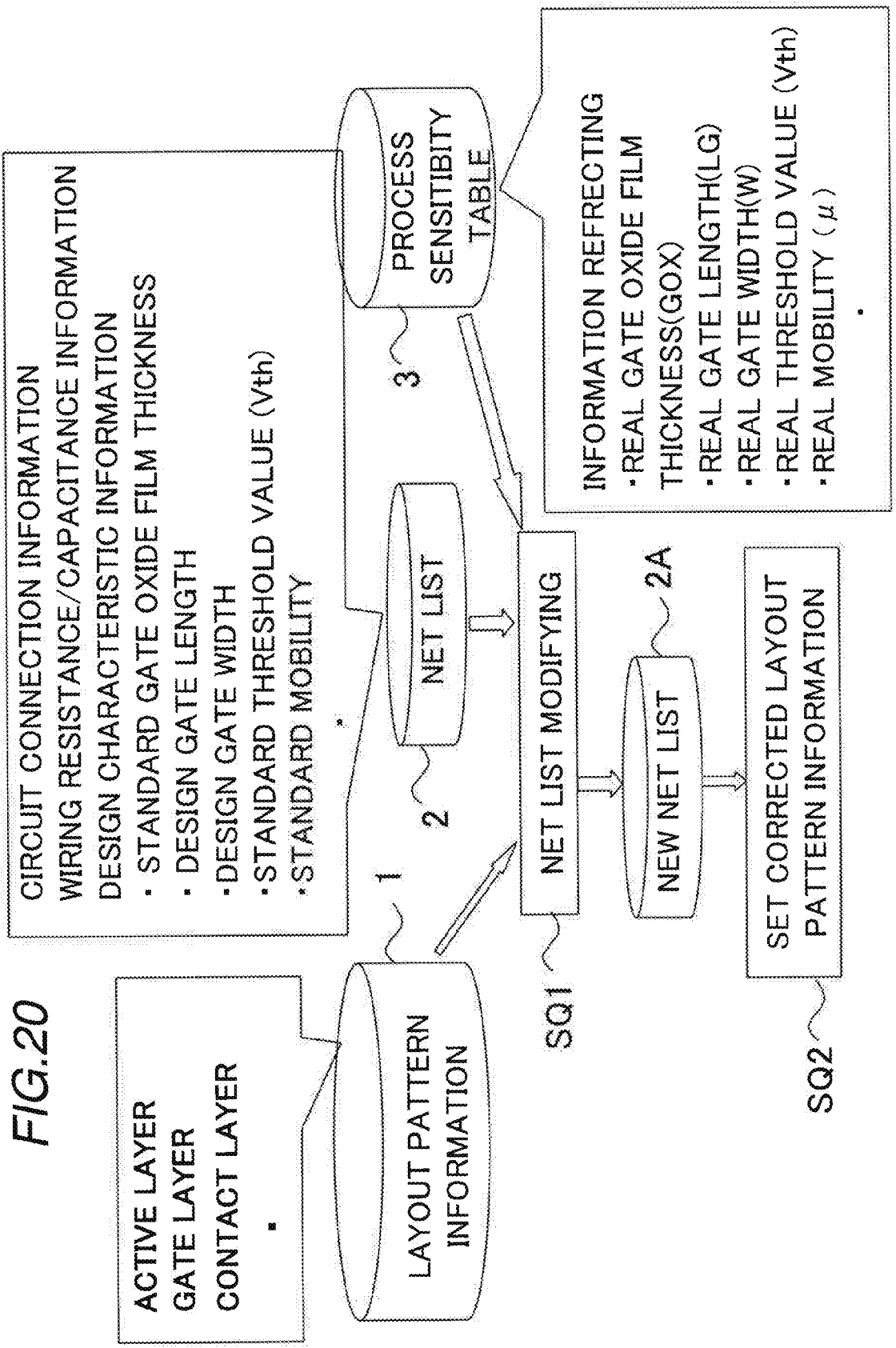
FIG. 20 is a diagram illustrating a process in a modified example.

Such being the case, before the conversion from the layout pattern information 1 to the simulation parameters 4, there may be executed the process of modifying the net list in a way that reflects the fluctuations in terms of the processes. FIG. 20 illustrates the process in this case. Herein, the modified net list is generated from the net list of the design values by use of a process sensitivity table 3.

The process sensitivity table 3 contains a conversion rule from the standard values corresponding to the layout pattern information 1 in the periphery of the elements to the real values, i.e., a real gate oxide film thickness (Gox), a real gate length (Lg), a real gate width (W), a real threshold voltage (Vth) and a real mobility (μ). Herein, the real values connote the dimensions of the circuit that is actually formed when the circuit is formed in the design pattern based on the standard values on the semiconductor substrate, and embrace empirical values, experimental values or the simulation values.

Figure 21:
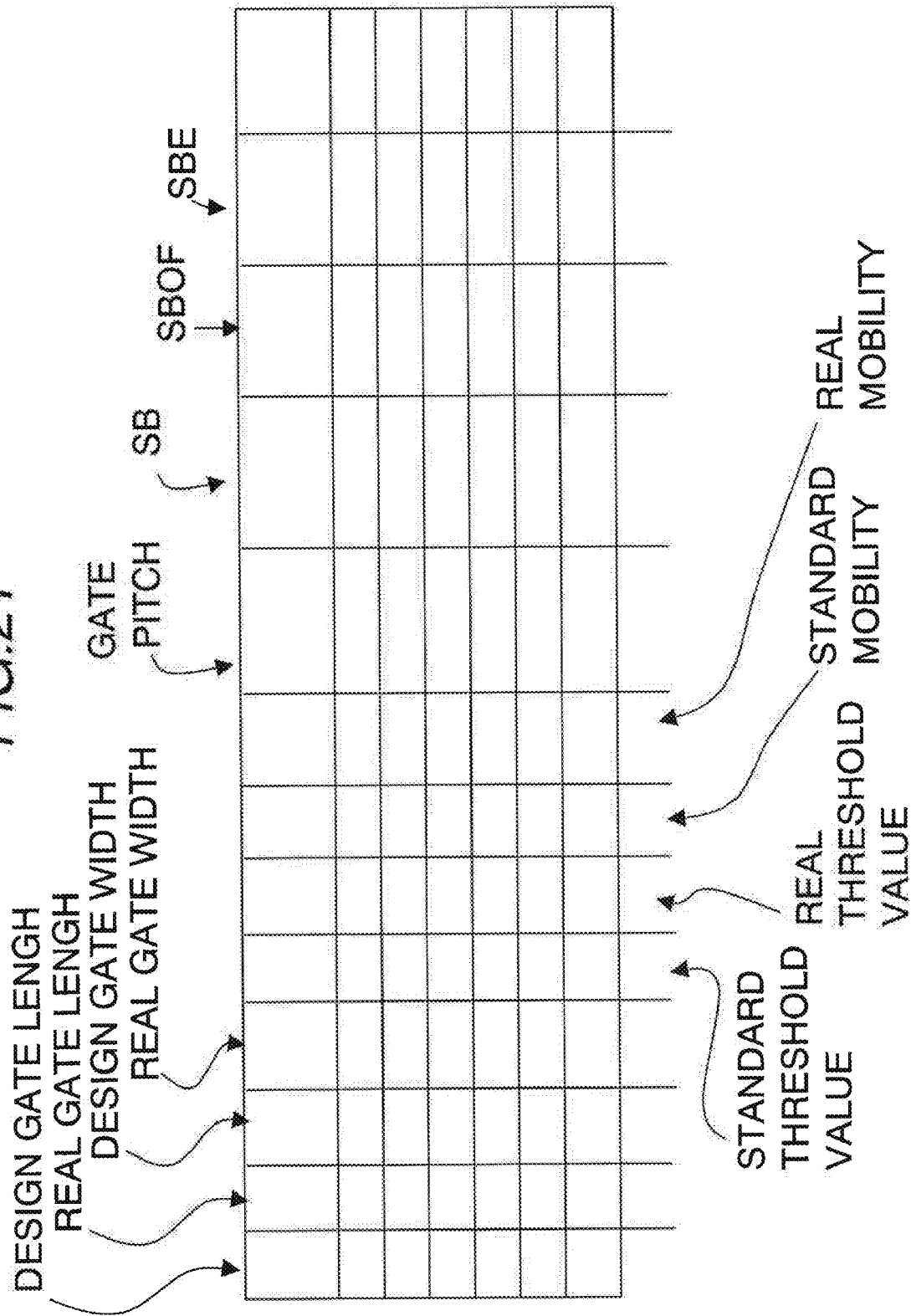
FIG. 21 is a diagram illustrating an example of a process sensitivity table.

This type of process sensitivity table 3 is described, for example, by use of the component parameters of the layout pattern information 1 illustrated in FIG. 4. FIG. 21 illustrates an example of the process sensitivity table 3 in this case. The process sensitivity table contains associative relations between the standard values and the real values for the component parameters. To be specific, in each of the rows of the process sensitivity table, the associative relations between the standard gate oxide film thickness and the real gate oxide film thickness (Gox), between the design gate length and the real gate length (Lg), between the design gate width and the real gate width (W), between the standard threshold voltage and the real threshold voltage (Vth) and between the standard mobility and the real mobility (μ) are defined for the gate pitch, SB, SBOF, SBE, etc.

A new net list 2A generated in a net list modifying process is registered with a multiplicity of combinations of these real values. The same processes as those in one embodiment may be executed for this type of net list 2A.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such example in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A semiconductor circuit design method using a simulator on a computer, simulating behaviors of a plurality of transistors with simulation parameters, and generating circuit characteristics of a semiconductor circuit including the plurality of transistors, the computer executing:
    converting component parameters extracted from dimensions of design patterns of components of the plurality of transistors configuring the semiconductor circuit or in-design physical characteristics of the transistors into simulation parameters inputted to the simulator;
    organizing the plurality of transistors included in the semiconductor circuit into a plurality of groups;
    selecting a selection group from the plurality of groups;
    setting fixed parameter values as the component parameters of the non-selected groups other than the selection group in the plurality of groups;
    setting combinations of the component parameters in the selection group;
    executing the simulation through the converting the component parameters;
    acquiring circuit characteristics with respect to each of the combination of the component parameters;
    selecting a group as a next selection group different from the selected groups;
    repeatedly executing the setting the fixed parameter values through the selecting a group as a next selection group different;
    obtaining a first mapping relation representing a relation between the plurality of circuit characteristics of the semiconductor circuit and the component parameters on the basis of results of the plurality of simulations executed based on the plural combinations of the component parameters;
    calculating values of the circuit characteristics corresponding to plurality of component parameters by use of the first mapping relation;
    selecting a part of the values of the plurality of circuit characteristics on the basis of at least any one of the values of the circuit characteristics and restriction items containing the component parameters; and
    obtaining component parameters corresponding to the selected values of the circuit characteristics, design patterns corresponding to the component parameters, or in-design physical characteristics of the transistors corresponding to the component parameters.

2. The semiconductor circuit design method according to claim 1, wherein the converting the component parameters includes:
    converting the component parameter into a transistor characteristic value for distinguishing between a signal characteristic of a transistor manufactured based on the component parameters and signal characteristics of other transistors; and
    converting the transistor characteristic value into the simulation parameter.

3. The semiconductor circuit design method according to claim 2, further comprising:
    generating a second mapping relation from the component parameter to the transistor characteristic value by use of combinations of transistor characteristic values measured from the transistors manufactured based on the component parameters and the component parameters at this time;
    extracting the transistor characteristic value for distinguishing between a signal characteristic of a transistor that is generated by executing the simulation in a way that sets a first value in the simulation parameter and a signal characteristic of a transistor that is generated by executing the simulation in a way that sets a second value different from the first value in the simulation parameter from one of the signal characteristics; and
    determining a third mapping relation from the transistor characteristic value to the simulation parameter on the basis of combinations of the transistor characteristic values obtained by setting a plurality of set values in the simulation parameters and the set values.

4. The semiconductor circuit design method according to claim 3, further obtaining a fourth mapping relation from the component parameters to the simulation parameters by applying the third mapping relation to the second mapping relation.

5. The semiconductor circuit design method according to claim 1, wherein the component parameters contain a gate length and a gate width.

6. The semiconductor circuit design method according to claim 1, wherein the signal characteristic is a characteristic of a curve representing a relation between a current or a voltage inputted to one terminal of the transistor and a current or a voltage measured at the same terminal as the former terminal or the other terminal of the transistor, and the transistor characteristic value is determined by one or more of a signal value at a specified point on the curve, a gradient of a tangential line of the curve, and an intersecting point between the tangential line and any one of coordinate axes.

7. The semiconductor circuit design method according to claim 1, wherein the organizing includes organizing the group per portion that determines a local signal delay in the semiconductor circuit.

8. The semiconductor circuit design method according to claim 7, wherein the portion determining the local signal delay includes a transistor becoming a drive unit for supplying a signal to a load within the semiconductor circuit and a transistor becoming the load driven by the signal transmitted from the drive unit.

9. The semiconductor circuit design method according to claim 1, wherein the organizing includes organizing, into a group to be selected as the selection group, transistors connected in series to a path extending to a ground potential from a power source for supplying electric power to the semiconductor circuit, one or series of transistors connected in parallel to between two points on the path and a transistor of which gate is connected to the path.

10. The semiconductor circuit design method according to claim 9, wherein the organizing includes organizing, into a same group, a plurality of groups containing in common any one of transistors connected in series or in parallel to the path.

11. The semiconductor circuit design method according to claim 1, wherein the obtaining the first mapping relation includes, modeling the plurality of circuit characteristics of the semiconductor circuit with the component parameters on the basis of the results of plurality of simulation by approximating the circuit characteristics in a polynomial in which variables are the component parameters.

12. The semiconductor circuit design method according to claim 11, wherein the polynomial contains a product of different variables with respect to the variables of the component parameters of the transistors in each group but does not contain the product of the variables between the groups with respect to the variables of the component parameters between the different groups.

13. The semiconductor circuit design method according to claim 1, wherein the circuit characteristics are a delay time of an output signal with respect to a combination of a plurality of input variations, a variation in this delay time, or standby power consumption in a plurality of input statuses.

14. The semiconductor circuit design method according to claim 1, wherein the restriction items include a design rule for at least one of gate length, gate width, a gate-to-gate space and a gate-to-contact space, and include a restriction item in which an index is a circuit area.

15. The semiconductor circuit design method according to claim 1, wherein at least one of the component parameters contains a reference value and a deviation from the reference value, the variable is a variable of the deviation, and the circuit characteristic is defined by a deviation from a reference value.

16. A semiconductor circuit manufacturing method including a semiconductor circuit computer aided design process in which a computer, by using a simulator on a computer, simulating behaviors of a plurality of transistors with simulation parameters, and generating circuit characteristics of a semiconductor circuit including the plurality of transistors, executes:

converting component parameters extracted from dimensions of design patterns of components of the plurality of transistors configuring the semiconductor circuit or in-design physical characteristics of the plurality of transistors into simulation parameters inputted to the simulator;

organizing the plurality of transistors included in the semiconductor circuit into a plurality of groups;

selecting a selection group from the plurality of groups;

setting fixed parameter values as the component parameters of the non-selected groups other than the selection group in the plurality of groups;

setting combinations of the component parameters in the selection group;

executing the simulation through the converting the component parameters;

acquiring circuit characteristics with respect to each combination of the component parameters;

selecting a group as a next selection group different from the selected groups;

repeatedly executing the setting the fixed parameter values through the selecting a group as a next selection group;

obtaining a first mapping relation representing a relation between the circuit characteristics of the semiconductor circuit and the component parameters on the basis of results of the plurality of simulations executed based on the plural combinations of the component parameters;

calculating values of plurality of circuit characteristics corresponding to plural combinations of values of the component parameters by use of the first mapping relation;

selecting a part of the plurality of values of the circuit characteristics on the basis of at least any one of the values of the circuit characteristics and restriction items containing the component parameters; and obtaining design data of the semiconductor circuit by acquiring component parameters corresponding to the selected values of the circuit characteristics, design patterns corresponding to the component parameters, or the in-design physical characteristics of the transistors corresponding to the component parameters, wherein the semiconductor circuit manufacturing method further includes:

manufacturing a photo mask on the basis of the design data of the semiconductor circuit obtained; and manufacturing the semiconductor circuit by use of the photo mask.

* * * * *